United States Patent
Chung et al.

(10) Patent No.: US 12,532,713 B2
(45) Date of Patent: Jan. 20, 2026

(54) METHOD FOR MANUFACTURING SEMICONDUCTOR DEVICE

(71) Applicant: Samsung Electronics Co., Ltd., Suwon-si (KR)

(72) Inventors: Sanggyo Chung, Suwon-si (KR); Chanmi Lee, Suwon-si (KR); Seunghee Han, Suwon-si (KR); Jungpyo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 414 days.

(21) Appl. No.: 18/125,873

(22) Filed: Mar. 24, 2023

(65) Prior Publication Data

US 2023/0377889 A1 Nov. 23, 2023

(30) Foreign Application Priority Data

May 23, 2022 (KR) .......................... 10-2022-0062593

(51) Int. Cl.
*H01L 21/033* (2006.01)
*H01L 21/311* (2006.01)

(52) U.S. Cl.
CPC .... *H01L 21/0337* (2013.01); *H01L 21/31144* (2013.01)

(58) Field of Classification Search
CPC ........... H01L 21/0337; H01L 21/31144; H01L 21/3086; H01L 21/3081; H01L 21/0332;
(Continued)

(56) References Cited

U.S. PATENT DOCUMENTS 7,531,456 B2 * 5/2009 Kwon ................. H01L 21/0338
438/738
7,790,360 B2 9/2010 Alapati et al.
(Continued)

FOREIGN PATENT DOCUMENTS

KR 1020090131173 A 12/2009
KR 1020170123377 A 11/2017
(Continued)

OTHER PUBLICATIONS

Office Action dated Oct. 23, 2023 from the Taiwan Intellectual Property Office for corresponding Taiwanese Patent Application No. 112112353.

*Primary Examiner* — Scott B Geyer
(74) *Attorney, Agent, or Firm* — Muir Patent Law, PLLC

(57) ABSTRACT

Provided is a method for manufacturing a semiconductor device, in which a mask layer, a buffer layer, and a first mandrel layer are sequentially stacked on a substrate including a first region and a second region. First mandrel patterns are formed on the buffer layer in the first region, and a second mandrel pattern covering the buffer layer in the second region is formed. A first spacer contacting side walls of the first mandrel pattern and the second mandrel pattern is formed on the buffer layer. The first mandrel patterns are removed. A buffer layer pattern and a preliminary mask pattern are formed on the substrate. The second mandrel pattern is removed. In addition, a mask pattern is formed. The buffer layer includes a material having lower electrical conductivity than the mask layer and having etching selectivity with respect to the mask layer.

20 Claims, 30 Drawing Sheets

(58) Field of Classification Search
CPC ......... H01L 21/027–0338; H01L 21/32; H01L 21/0271–0279; H01L 21/312–3128; H01L 21/033–0338; H01L 21/314–3185; H01L 21/7681; H01L 21/76811; H10B 12/053; H10B 12/09

See application file for complete search history.

(56) References Cited

U.S. PATENT DOCUMENTS

| | | | |
|---|---|---|---|
| 8,956,962 | B2 | 2/2015 | Lee et al. |
| 9,099,470 | B2 | 8/2015 | Lee et al. |
| 9,123,659 | B1 * | 9/2015 | Fu ................... H10D 84/038 |
| 9,324,574 | B2 | 4/2016 | Kang |
| 9,379,017 | B1 * | 6/2016 | Sung ............... H01L 21/31144 |
| 9,837,273 | B2 | 12/2017 | Lee et al. |
| 10,205,003 | B1 * | 2/2019 | Cheng ............. H01L 21/02461 |
| 10,304,680 | B1 | 5/2019 | Lee et al. |
| 10,483,108 | B2 * | 11/2019 | Lian ................ H01L 21/31111 |
| 10,522,366 | B2 | 12/2019 | Lee et al. |
| 2009/0311861 | A1 * | 12/2009 | Park ................... H01L 21/0337 257/E21.582 |
| 2014/0045336 | A1 | 2/2014 | Park |
| 2017/0025539 | A1 * | 1/2017 | Lee .................... H10D 62/86 |
| 2017/0271163 | A1 * | 9/2017 | Sung ................. H01L 21/3085 |
| 2018/0315595 | A1 * | 11/2018 | Lian ................ H01L 21/31111 |
| 2020/0035499 | A1 * | 1/2020 | Park ................... H01L 21/3086 |
| 2020/0321215 | A1 * | 10/2020 | Fan .................... H01L 21/0332 |
| 2021/0134595 | A1 | 5/2021 | Su et al. |
| 2021/0366704 | A1 | 11/2021 | Lian et al. |
| 2022/0013359 | A1 | 1/2022 | Koshizawa et al. |
| 2022/0270879 | A1 * | 8/2022 | Cao ..................... H10D 1/716 |

FOREIGN PATENT DOCUMENTS

| | | |
|---|---|---|
| KR | 102223035 B1 | 3/2021 |
| KR | 102250656 B1 | 5/2021 |
| KR | 1020210105048 A | 8/2021 |
| TW | 202109619 A | 3/2021 |

* cited by examiner

METHOD FOR MANUFACTURING SEMICONDUCTOR DEVICE

CROSS-REFERENCE TO RELATED APPLICATION

This application claims priority under 35 USC § 119 to Korean Patent Application No. 10-2022-0062593 filed on May 23, 2022 in the Korean Intellectual Property Office (KIPO), the entire disclosure of which is herein incorporated by reference.

BACKGROUND

1. Field

Embodiments of the present disclosure relate to a method for manufacturing a semiconductor device. More particularly, embodiments of the present disclosure relate to a method for forming patterns included in a semiconductor device.

2. Description of the Related Art

A semiconductor device may include a first region in which memory cells are formed, and a second region that is the remaining region. First and second active patterns having mutually different pattern densities and mutually different pattern widths may be formed in the first region and the second region of a substrate, respectively. As semiconductor devices are highly integrated, the first active patterns may be arranged with a narrow width and a high density. Accordingly, it is not easy to form the first and second active patterns in the first region and the second region of the substrate.

SUMMARY

Example embodiments provide a method for manufacturing a semiconductor device, capable of reducing process defects.

According to embodiments of the present disclosure, there is provided a method for manufacturing a semiconductor device, in which a mask layer, a buffer layer, a first mandrel layer, and a second mandrel layer are sequentially stacked on a substrate including a first region and a second region. First mandrel patterns having a line shape while being spaced apart from each other are formed on the first region, and a second mandrel pattern covering the first mandrel layer is formed on the second region, by patterning the second mandrel layer. A first spacer contacting a side wall of the first mandrel pattern and a side wall of the second mandrel pattern is formed on the first mandrel layer. The first mandrel patterns are removed. Third mandrel patterns having a line shape are formed on the buffer layer in the first region, and a fourth mandrel pattern covering the buffer layer in the second region is formed, by patterning the first mandrel layer by using the first spacer and the second mandrel pattern as an etching mask. A second spacer contacting side walls of the third mandrel pattern and the fourth mandrel pattern is formed on a top surface of the buffer layer. The third mandrel patterns are removed. A buffer layer pattern and a preliminary mask pattern are formed on the substrate including the first region and the second region by etching the buffer layer and a portion of the mask layer by using the second spacer and the fourth mandrel pattern as an etching mask. The fourth mandrel pattern is removed. In addition, a mask pattern is formed by etching the preliminary mask pattern by using the buffer layer pattern as an etching mask. The buffer layer includes a material having lower electrical conductivity than the mask layer and having etching selectivity with respect to the mask layer.

According to embodiments of the present disclosure, there is provided a method for manufacturing a semiconductor device, in which a mask layer, a buffer layer, a first mandrel layer, a separation layer, and a second mandrel layer are sequentially stacked on a substrate including a first region and a second region. First mandrel patterns having a line shape while being spaced apart from each other are formed on the first mandrel layer in the first region, and a second mandrel pattern covering the first mandrel layer is formed on the first mandrel layer in the second region, by patterning the second mandrel layer. A first spacer contacting a side wall of the first mandrel pattern and a side wall of the second mandrel pattern is formed on the first mandrel layer. The first mandrel patterns are removed. Third mandrel patterns and first separation layer patterns having a line shape are formed on the buffer layer in the first region, and a fourth mandrel pattern and a second separation layer pattern covering the buffer layer in the second region are formed, by patterning the separation layer and the first mandrel layer by using the first spacer and the second mandrel pattern as an etching mask. A second spacer contacting side walls of the third mandrel pattern, the first separation layer pattern, the fourth mandrel pattern, and the second separation layer pattern is formed on a top surface of the buffer layer. The third mandrel patterns and the first separation layer patterns are removed. A buffer layer pattern and a preliminary mask pattern are formed on the substrate including the first region and the second region by etching the buffer layer and a portion of the mask layer by using the second spacer and the fourth mandrel pattern as an etching mask and removing the second separation layer pattern. The fourth mandrel pattern is removed. In addition, a mask pattern is formed by etching the preliminary mask pattern by using the buffer layer pattern as an etching mask. The buffer layer includes a material having lower electrical conductivity than the mask layer and having etching selectivity with respect to the mask layer.

According to embodiments of the present disclosure, there is provided a method for manufacturing a semiconductor device, in which a mask layer, a buffer layer, and a first mandrel layer are sequentially stacked on a substrate including a first region and a second region. First mandrel patterns having a line shape are formed on the buffer layer in the first region, and a second mandrel pattern covering the buffer layer in the second region is formed, by patterning the first mandrel layer. A first spacer contacting side walls of the first mandrel pattern and the second mandrel pattern is formed on the buffer layer. The first mandrel patterns are removed. A buffer layer pattern and a preliminary mask pattern are formed on the substrate including the first region and the second region by etching the buffer layer and a portion of the mask layer by using the first spacer and the second mandrel pattern as an etching mask. The second mandrel pattern is removed. In addition, a mask pattern is formed by etching the preliminary mask pattern by using the buffer layer pattern as an etching mask. The buffer layer includes a material having lower electrical conductivity than the mask layer and having etching selectivity with respect to the mask layer.

According to the method for manufacturing the semiconductor device of exemplary embodiments, the buffer layer may be disposed on an etching target layer, so that an electromagnetic force generated by high electrical conductivity of the etching target layer can be reduced so as to reduce a defect in which the spacer is bent. In addition, the buffer layer may be used as an etching mask for etching the etching target layer, so that an etching process having a high selectivity can be performed so as to reduce process defects.

DETAILED DESCRIPTION OF THE EMBODIMENTS

Hereinafter, exemplary embodiments of the present disclosure will be described in detail with reference to the accompanying drawings.

Hereinafter, two directions that are parallel to a top surface of a substrate and perpendicular to each other will be referred to as first and second directions, respectively. In addition, a direction that is parallel to the top surface of the substrate and oblique with respect to the first direction will be referred to as a third direction. The third direction may correspond to a longitudinal direction of an active pattern of a memory cell region.

FIGS. 1 to 18 are sectional views and plan views showing a method for manufacturing a semiconductor device according to an exemplary embodiment.

Figure 11:
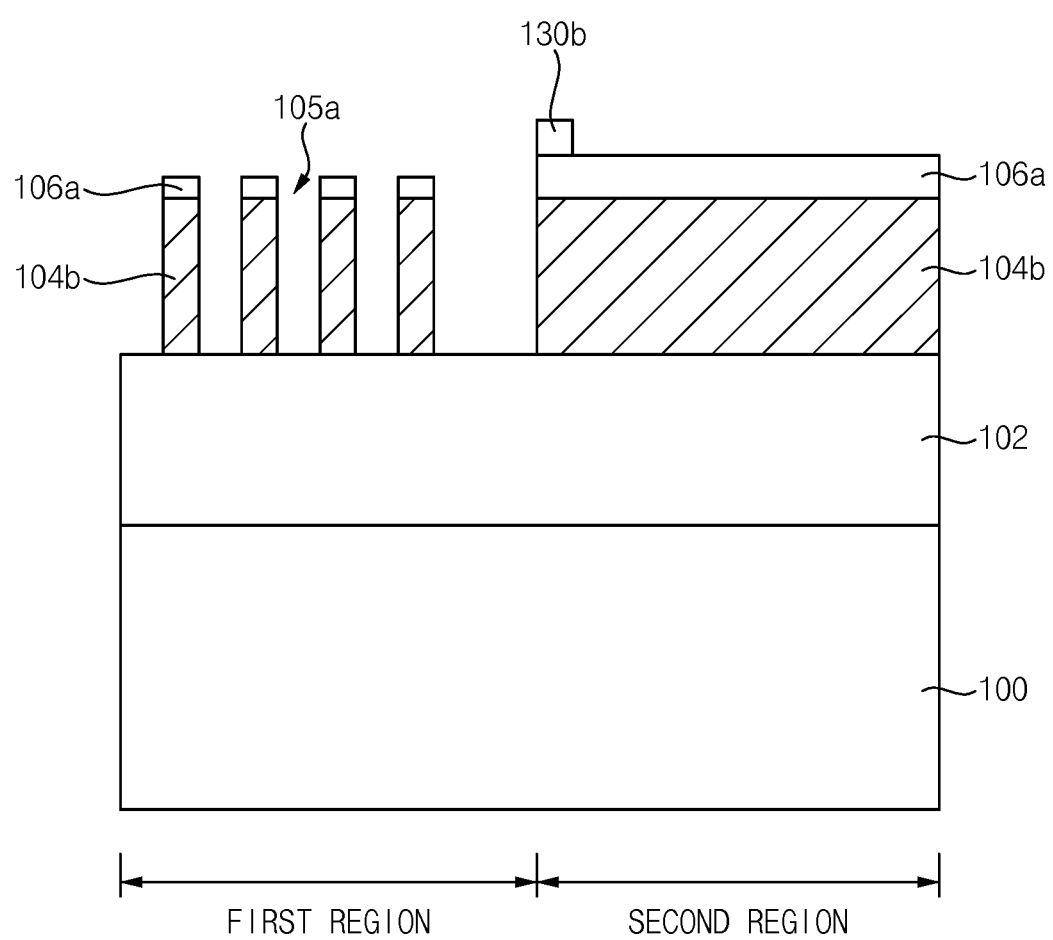
Figure 12:
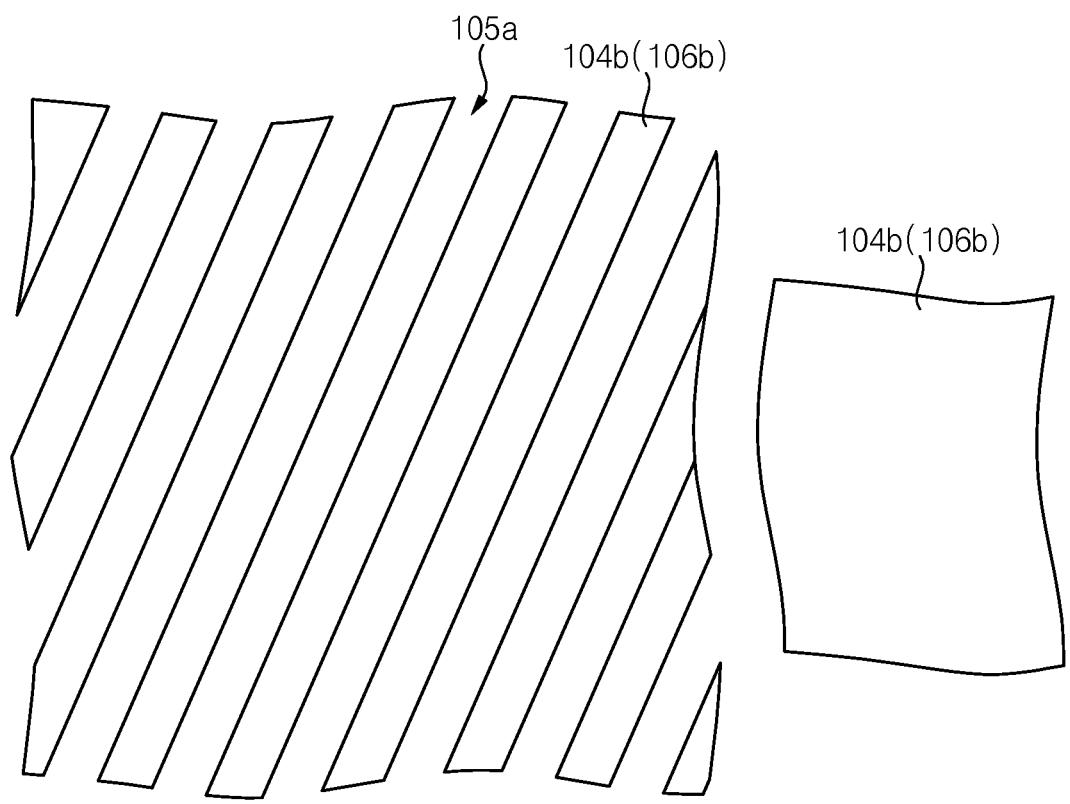
Figure 13:
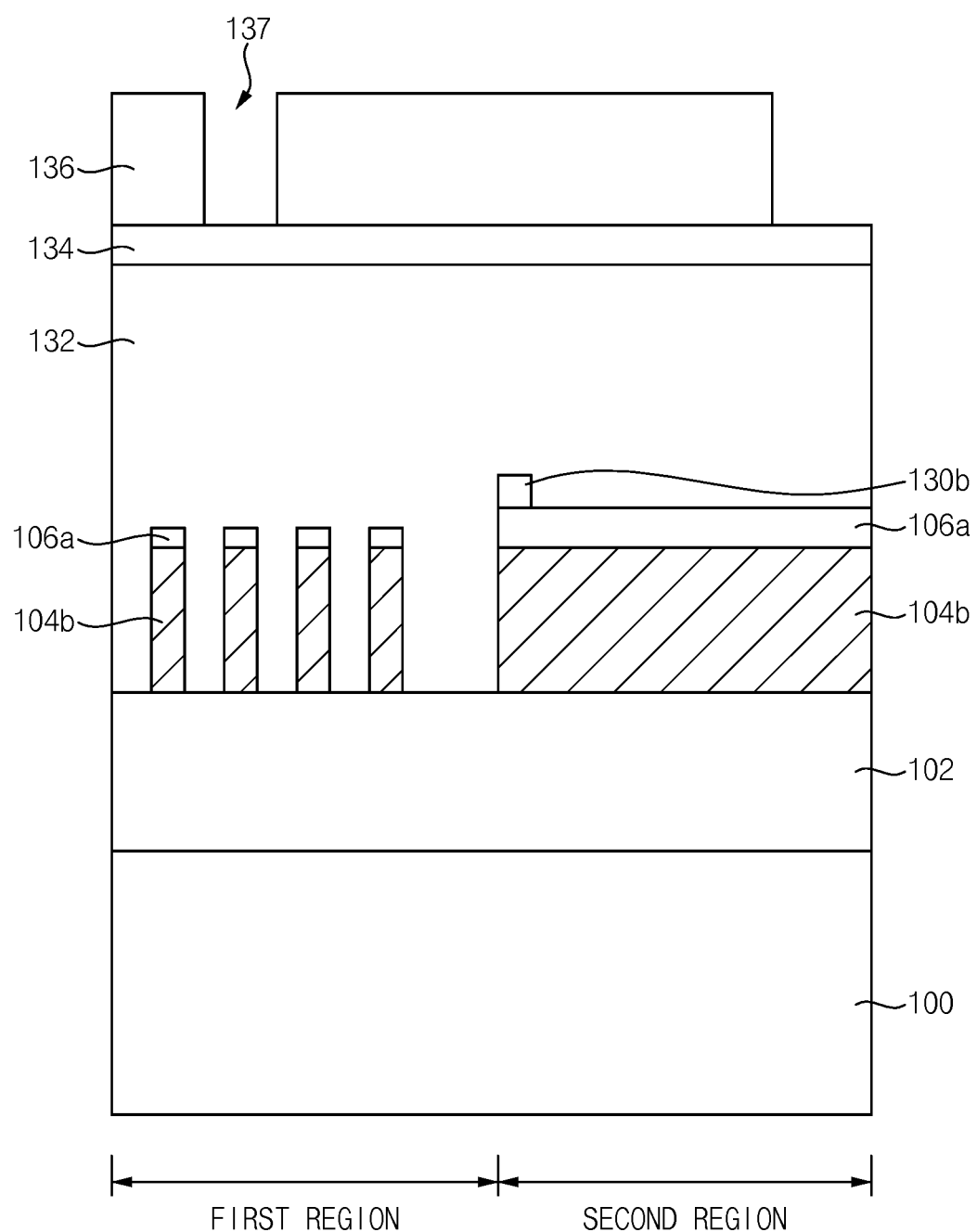
Figure 14:
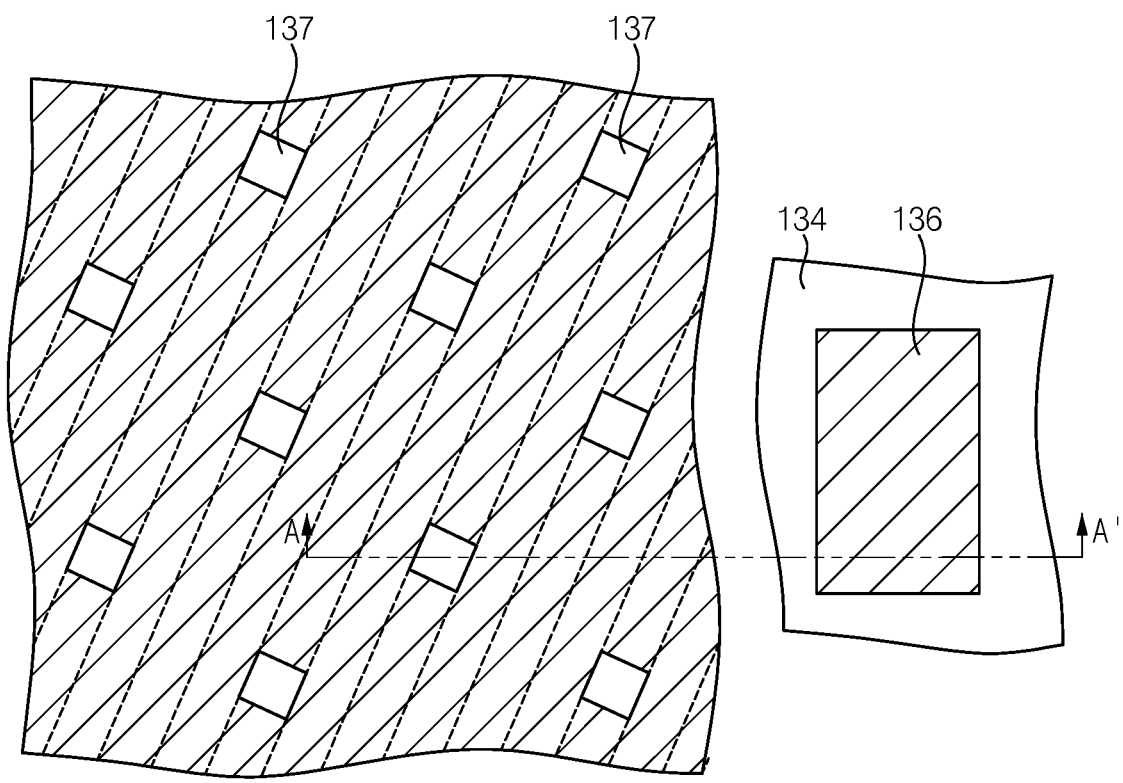
Figure 15:
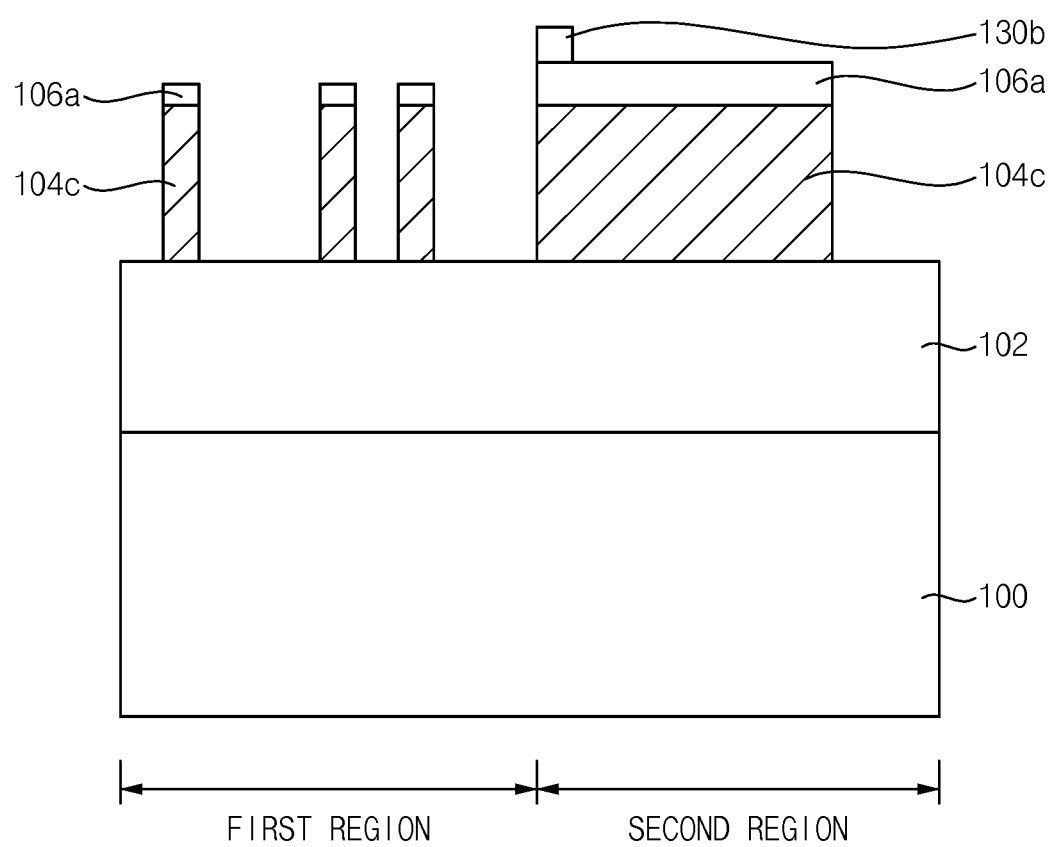
Figure 16:
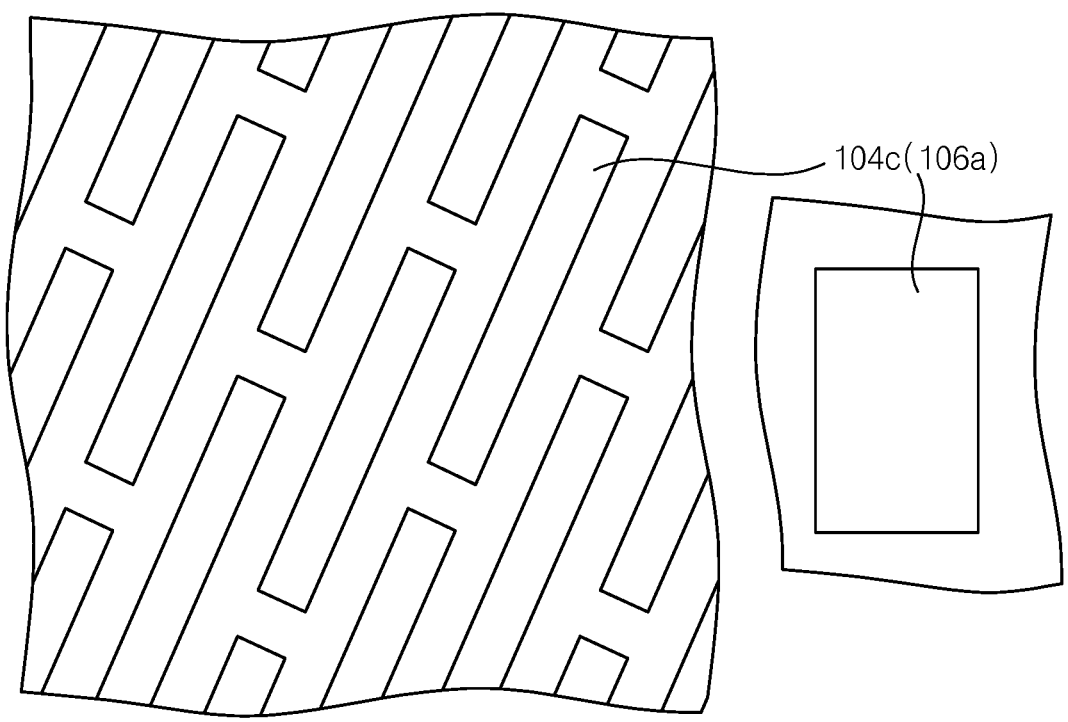

FIGS. 12, 14, and 16 are plan views, and FIGS. 1 to 11, 13, 15, 17, and 18 are sectional views. Each of the sectional views is taken along a portion corresponding to A-A' of FIG. 14.

Figure 1:
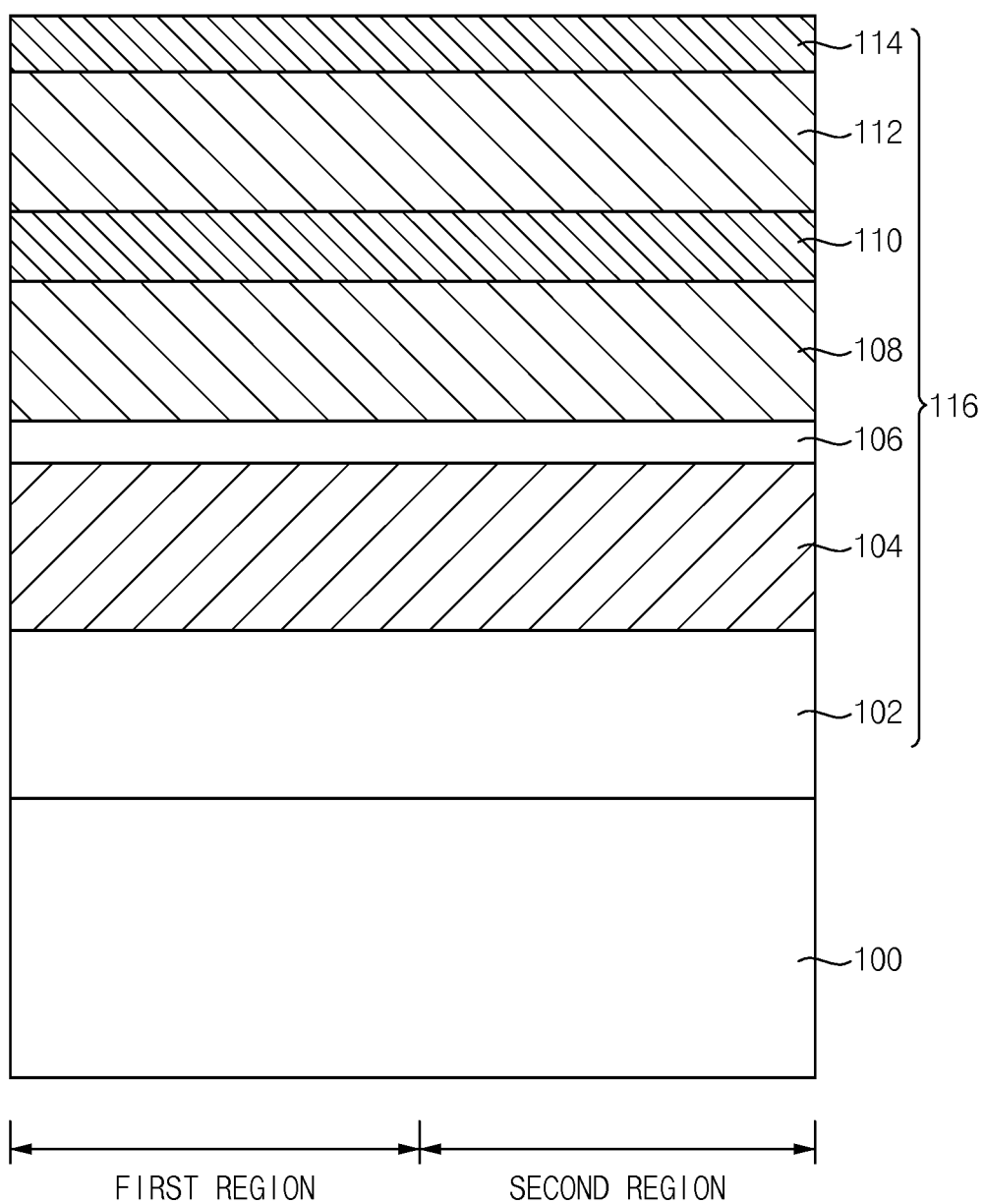
FIGS. 1 to 18 are sectional views and plan views showing a method for manufacturing a semiconductor device according to an exemplary embodiment.

Referring to FIG. 1, a mask layer structure 116 in which layers provided as etching mask layers are stacked may be formed on a substrate 100.

The substrate 100 may include a first region in which memory cells are formed, and a second region other than the first region. The second region may include a peripheral circuit region, and a boundary region formed between the memory cell region and the peripheral circuit region. In the following description, each of the first and second regions may include a surface of the substrate 100 and regions above, in a vertical direction, the surface of the substrate 100.

The substrate 100 may include or may be formed of a single crystal semiconductor material. The substrate 100 may include or may be formed of a semiconductor material such as silicon, germanium, and silicon-germanium. According to an exemplary embodiment, the substrate 100 may be formed of single crystal silicon.

The mask layer structure 116 may include at least one mask layer 102 and 104, a buffer layer 106, a first mandrel layer 108, and a second mandrel layer 112. In an embodiment, at least one mask layer 102 and 104 and the first mandrel layer 108 may include or may be formed of the same material. The present invention is not limited thereto. In an embodiment, at least one mask layer 102 and 104 and the first mandrel layer 108 may include or may be formed of mutually different materials.

According to the exemplary embodiment, the mask layer structure 116 may be configured such that a first mask layer 102, a second mask layer 104, the buffer layer 106, the first mandrel layer 108, a first separation layer 110, the second mandrel layer 112, and a second separation layer 114 are sequentially stacked.

The first mask layer 102 may be provided as a mask layer for etching or patterning the substrate in a manufacturing process. The first mask layer 102 may include or may be formed of a material having etching selectivity with respect to the substrate 100. The first mask layer 102 may include or may be formed of, for example, a silicon oxide layer. The second mask layer 104 may be provided to pattern the first mask layer 102. Therefore, the second mask layer 104 may include or may be formed of a material having etching selectivity with respect to the first mask layer 102. The second mask layer 104 may include or may be formed of, for example, polysilicon.

The buffer layer 106 may be provided to reduce defects caused by electrical conductivity of the second mask layer 104 located under the buffer layer 106. According to the exemplary embodiment, the buffer layer 106 may include or may be formed of a material having lower electrical conductivity than the second mask layer (e.g., polysilicon) located under the buffer layer 106.

According to the exemplary embodiment, the buffer layer 106 may include or may be formed of the same material as a second spacer formed on a side wall of a third mandrel pattern in a subsequent process.

The second spacer may be provided as an etching mask for patterning the second mask layer. The buffer layer 106 may be provided as a portion of an etching mask for etching the second mask layer 104 located under the buffer layer 106. Therefore, the buffer layer 106 may include or may be formed of a material having etching selectivity with respect to the second mask layer 104.

As one example, the second spacer may include or may be formed of silicon oxide, and the buffer layer 106 may include or may be formed of an insulating material including a silicon-oxygen bond. For example, the buffer layer 106 may include or may be formed of silicon oxide or silicon oxynitride. Hereinafter, an example in which the second spacer and the buffer layer 106 are formed of silicon oxide will be described.

The buffer layer 106 may be formed between the second mask layer 104 and the first mandrel layer 108. The buffer layer 106 may have a thickness that is thinner than each of a thickness of the second mask layer 104 and a thickness of the first mandrel layer 108. When the buffer layer is thinner than 50 Å, it may be difficult to provide the buffer layer as an etching mask in a subsequent process, and when the buffer layer 106 is thicker than 300 Å, it may not be easy to remove the buffer layer, and other layers (e.g., the second spacer) may also be consumed upon removal of the buffer layer 106. According to the exemplary embodiment, the buffer layer 106 may have a thickness selected from a range of 50 Å to 300 Å.

According to the exemplary embodiment, the buffer layer 106 may be formed using an atomic layer deposition (ALD) process.

The first mandrel layer 108 may include or may be formed of a material having etching selectivity with respect to the second spacer. In addition, since the first mandrel layer 108 is a sacrificial layer used to form the second spacer, the first mandrel layer 108 may include or may be formed of a material that may be easily removed. According to the exemplary embodiment, the first mandrel layer 108 may include or may be formed of amorphous carbon. The first separation layer 110 may include or may be formed of silicon oxynitride. The first separation layer 110 may have a thickness that is thinner than a thickness of the first mandrel layer 108.

The second mandrel layer 112 may include or may be formed of a spin-on hard mask material. The spin-on hard mask material may include or may be formed of amorphous carbon. Therefore, in order to separate the first and second mandrel layers 108 and 112 from each other, the first separation layer 110 may be interposed between the first and second mandrel layers 108 and 112.

The second separation layer 114 may include or may be formed of silicon oxynitride. The second separation layer 114 may have a thickness that is thinner than a thickness of the second mandrel layer 112.

The first and second separation layers 110 and 114 may be provided to separate upper and lower layers from each other. In addition, the first and second separation layers 110 and 114 may also be used as anti-reflection layers.

Figure 2:
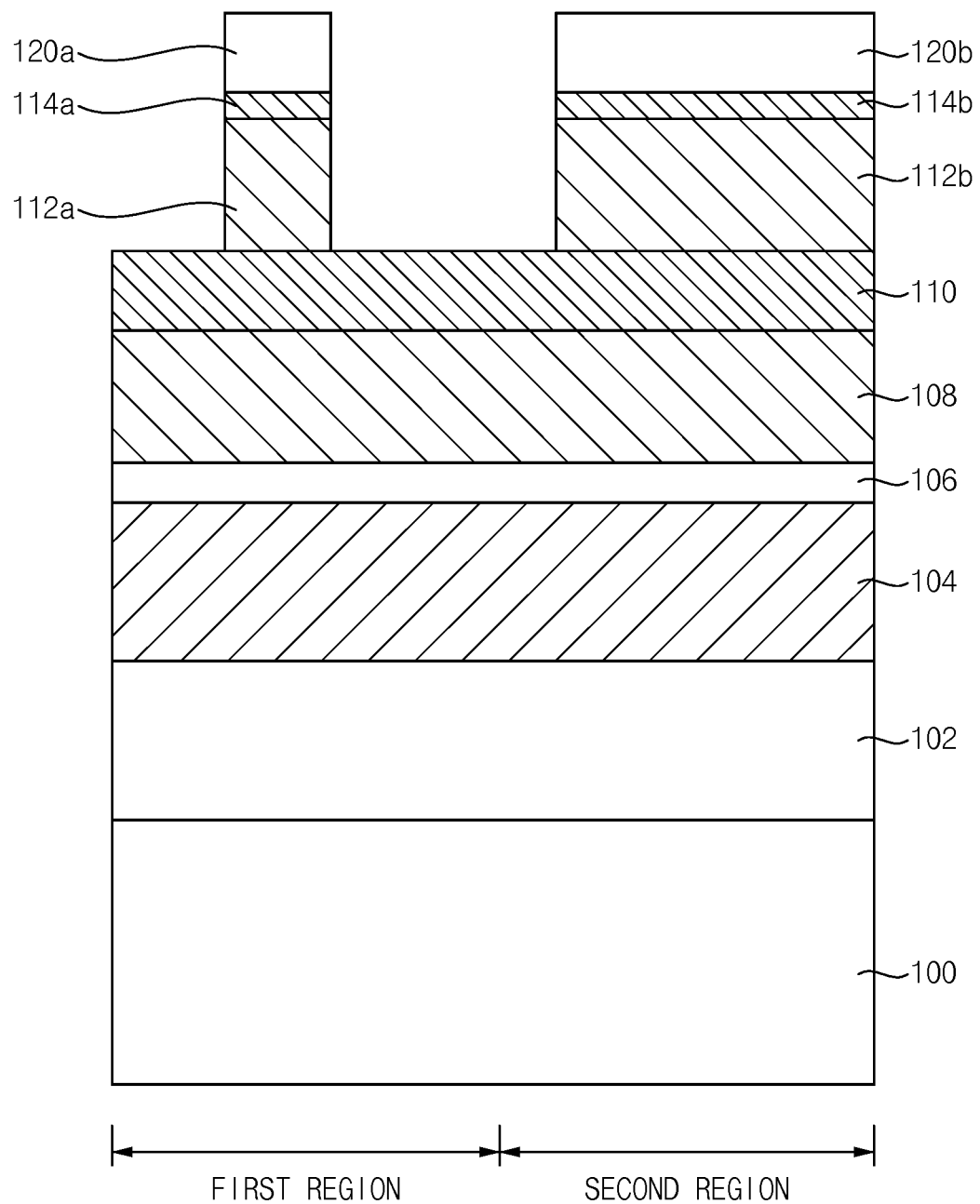

Referring to FIG. 2, a first photoresist pattern 120a may be formed on the mask layer structure 116 in the first region, and a second photoresist pattern 120b may be formed on the mask layer structure 116 in the second region.

According to the exemplary embodiment, the first photoresist pattern 120a may have a line shape extending in the third direction.

Although only one first photoresist pattern 120a has been shown in FIG. 2, a plurality of first photoresist patterns 120a may be arranged while being spaced apart from each other. The first photoresist pattern 120a may have a line width that is approximately three times a first line width, which is a target line width of a final pattern to be formed. In addition, a gap portion between the first photoresist patterns 120a may have a line width that is approximately five times the first line width. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Meanwhile, the second photoresist pattern 120b may cover the mask layer structure 116 on the second region. Accordingly, a width of the second photoresist pattern 120b may be greater than a width of the first photoresist pattern 120a.

The second separation layer 114 and the second mandrel layer 112 may be sequentially etched by using the first and second photoresist patterns 120a and 120b as an etching mask. Therefore, a first mandrel pattern 112a and a first separation layer pattern 114a may be formed on the first separation layer 110 in the first region, and a second mandrel pattern 112b and a second separation layer pattern 114b may be formed on the first separation layer 110 in the second region. In an embodiment, a width of the second mandrel pattern 112b may be greater than a width of the first mandrel pattern 112a.

Thereafter, the first and second photoresist patterns 120a and 120b may be removed.

Figure 3:
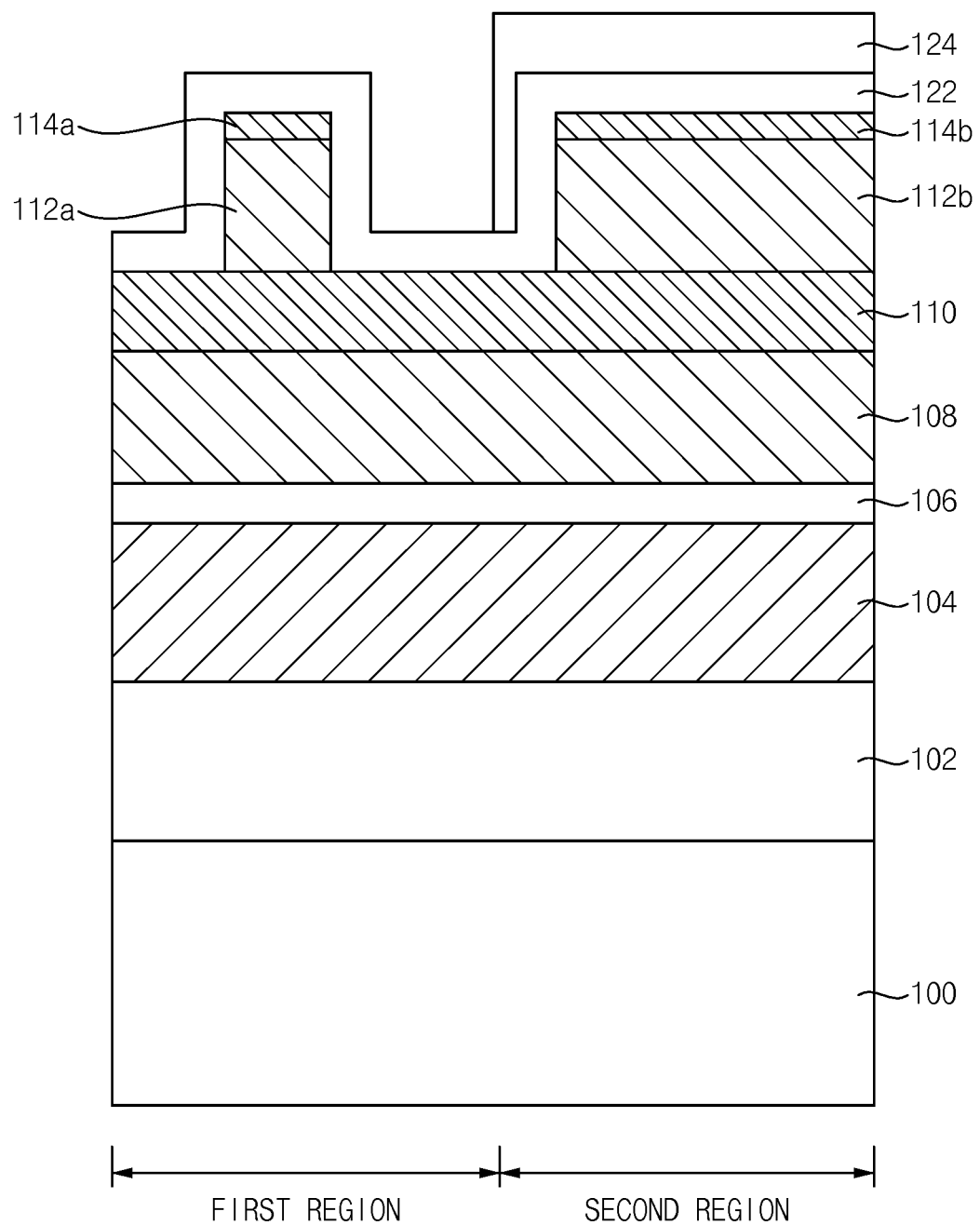

Referring to FIG. 3, a first spacer layer 122 may be conformally formed on the first mandrel pattern 112a, the first separation layer pattern 114a, the second mandrel pattern 112b, the second separation layer pattern 114b, and the first separation layer 110.

The first spacer layer 122 may be provided as an etching mask for etching the first separation layer 110 and the first mandrel layer 108 formed under the first spacer layer 122. According to the exemplary embodiment, the first spacer layer 122 may include or may be formed of silicon oxide.

According to the exemplary embodiment, the first spacer layer 122 may be deposited to have a thickness that is substantially equal to the first line width. In order to form the first spacer layer 122 with a thin thickness, the first spacer layer 122 may be formed using an atomic layer deposition (ALD) process.

A third photoresist pattern 124 may be formed on the first spacer layer 122. The third photoresist pattern 124 may cover the first spacer layer 122 formed on surfaces of the second mandrel pattern 112b and the second separation layer pattern 114b. The third photoresist pattern 124 may selectively expose the first spacer layer 122 on the first region.

Figure 4:
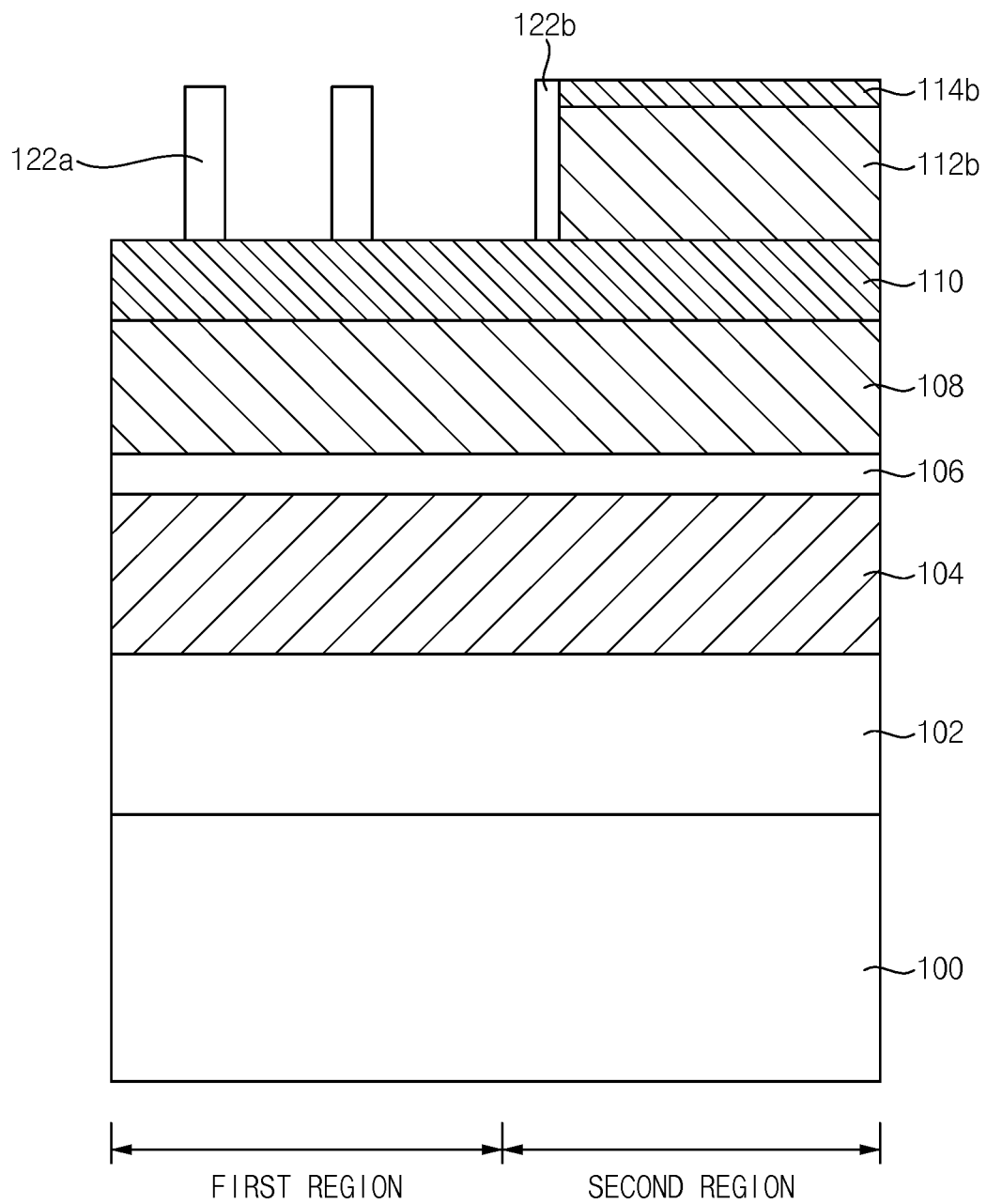

Referring to FIG. 4, the first spacer layer 122 may be anisotropically etched to form a first spacer 122a on side walls of the first mandrel pattern 112a and the first separation layer pattern 114a. In other words, the first spacer 122a may be formed on the first separation layer 110 in the first region.

In this case, since the first spacer layer 122 on the second region is masked by the third photoresist pattern 124, the first spacer layer may cover surfaces of the second mandrel pattern 112b and the second separation layer pattern 114b on the second region.

Thereafter, the first separation layer pattern 114a and the first mandrel pattern 112a may be selectively removed. Therefore, the first spacers 122a may be spaced apart from each other on the first separation layer 110 in the first region. Meanwhile, since the first spacer layer 122 covers the surfaces of the second mandrel pattern 112b and the second separation layer pattern 114b on the second region, the second mandrel pattern 112b and the second separation layer pattern 114b may remain without being removed in the removal process of the first separation layer pattern 114a and the first mandrel pattern 112a. The process of removing the first mandrel pattern 112a may include an ashing process.

Thereafter, the first spacer layer 122 formed on top surfaces of the second mandrel pattern 112b and the second separation layer pattern 114b may be removed. In this case, the first spacer may partially remain on one side walls of the second mandrel pattern 112b and the second separation layer pattern 114b located at a boundary portion between the first region and the second region.

Figure 5:
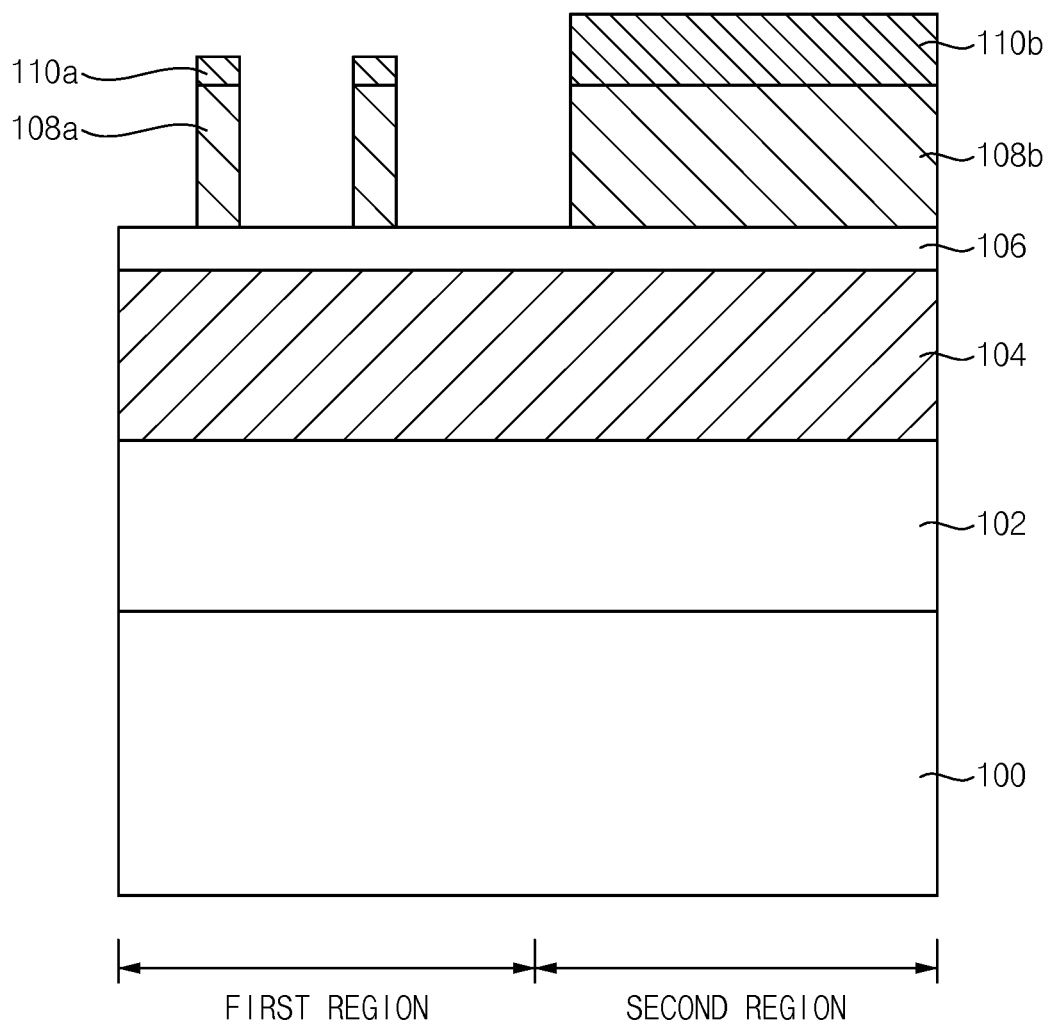

Referring to FIG. 5, by using the first spacers 122a as an etching mask, the first separation layer 110 exposed between the first spacers 122a may be anisotropically etched, and subsequently, the first mandrel layer 108 may be etched. Therefore, a structure in which a third mandrel pattern 108a and a third separation layer pattern 110a are stacked may be formed on the buffer layer 106 in the first region.

When the etching process is performed, the second separation layer pattern 114b and the second mandrel pattern 112b on the second region may also be removed. In addition, since the second separation layer pattern 114b and the second mandrel pattern 112b on the second region are used as an etching mask, a structure in which a fourth mandrel pattern 108b and a fourth separation layer pattern 110b covering the second region are stacked may be formed on the buffer layer 106 in the second region.

As described above, mutually different etching masks may be used for the first region and the second region in the etching process. Since the first spacers 122a on the first region are rapidly consumed due to a three-dimensional effect when the anisotropic etching process is performed, an upper portion of the third separation layer pattern 110a on the first region may be removed by a partial thickness. The phrase "by a partial thickness" refers to partially removing in a vertical direction perpendicular to an upper surface of the substrate 100 or refers to a thickness partially removed in the vertical direction. Meanwhile, the fourth separation layer pattern 110b on the second region, which has a wider width than the third separation layer pattern 110a, may be rarely removed by etching loading. Therefore, the third separation layer pattern 110a may be thinner than the fourth separation layer pattern 110b.

Figure 6:
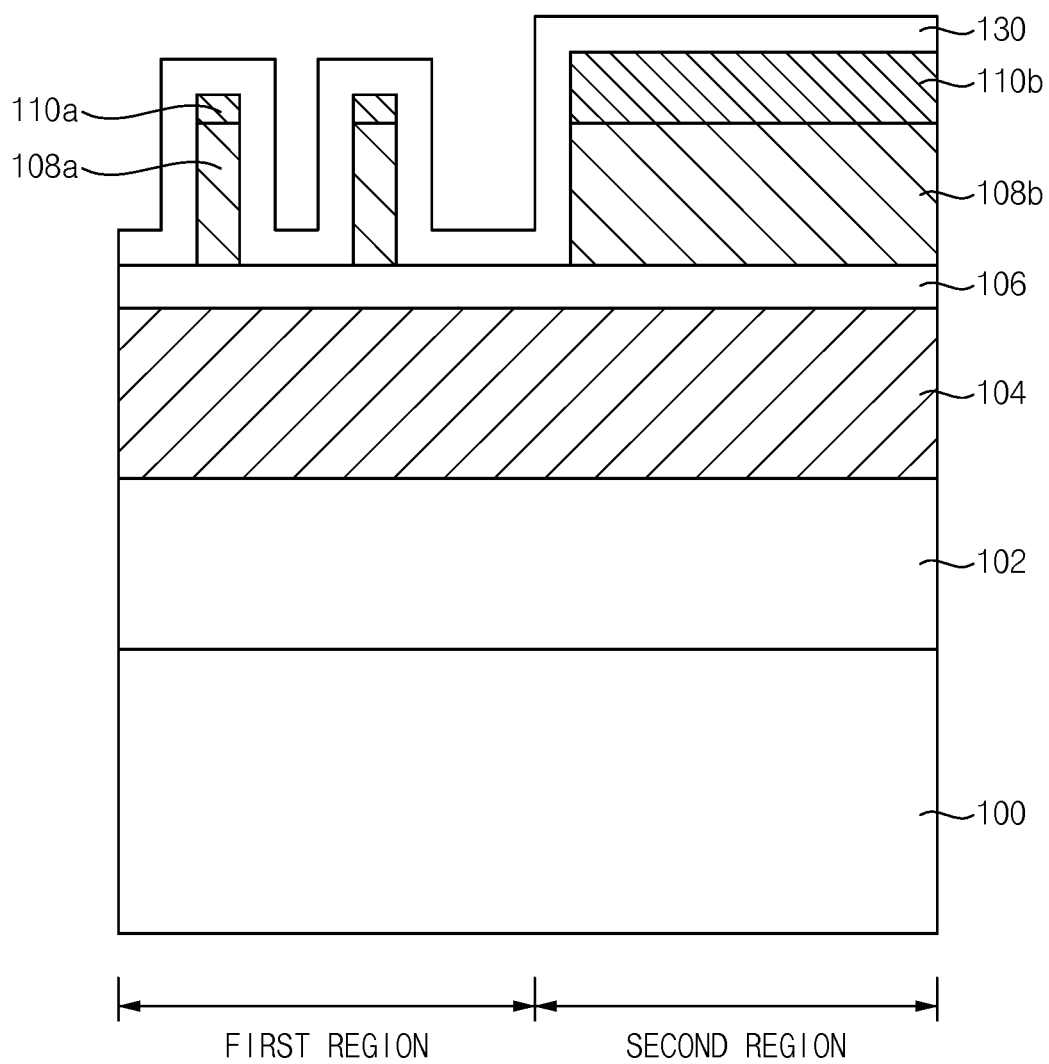

Referring to FIG. 6, a second spacer layer 130 may be conformally formed on the third mandrel pattern 108a, the third separation layer pattern 110a, the fourth mandrel pattern 108b, the fourth separation layer pattern 110b, and the buffer layer 106.

The second spacer layer 130 may be provided as an etching mask for etching the second mask layer 104 formed under the second spacer layer 130. Therefore, the second spacer layer 130 may include or may be formed of a material having etching selectivity with respect to the second mask layer. According to the exemplary embodiment, the second spacer layer 130 may include or may be formed of silicon oxide.

The second spacer layer 130 may be deposited to have a thickness that is substantially equal to the first line width. In order to form the second spacer layer 130 with a thin thickness, the second spacer layer 130 may be formed using an atomic layer deposition (ALD) process.

As described above, the second spacer layer 130 may contact the buffer layer 106. Therefore, the second spacer layer 130 may not contact the second mask layer 104, which is an etching target layer. The term "contact," as used herein, refers to a direct connection (i.e., touching) unless the context indicates otherwise.

Figure 7:
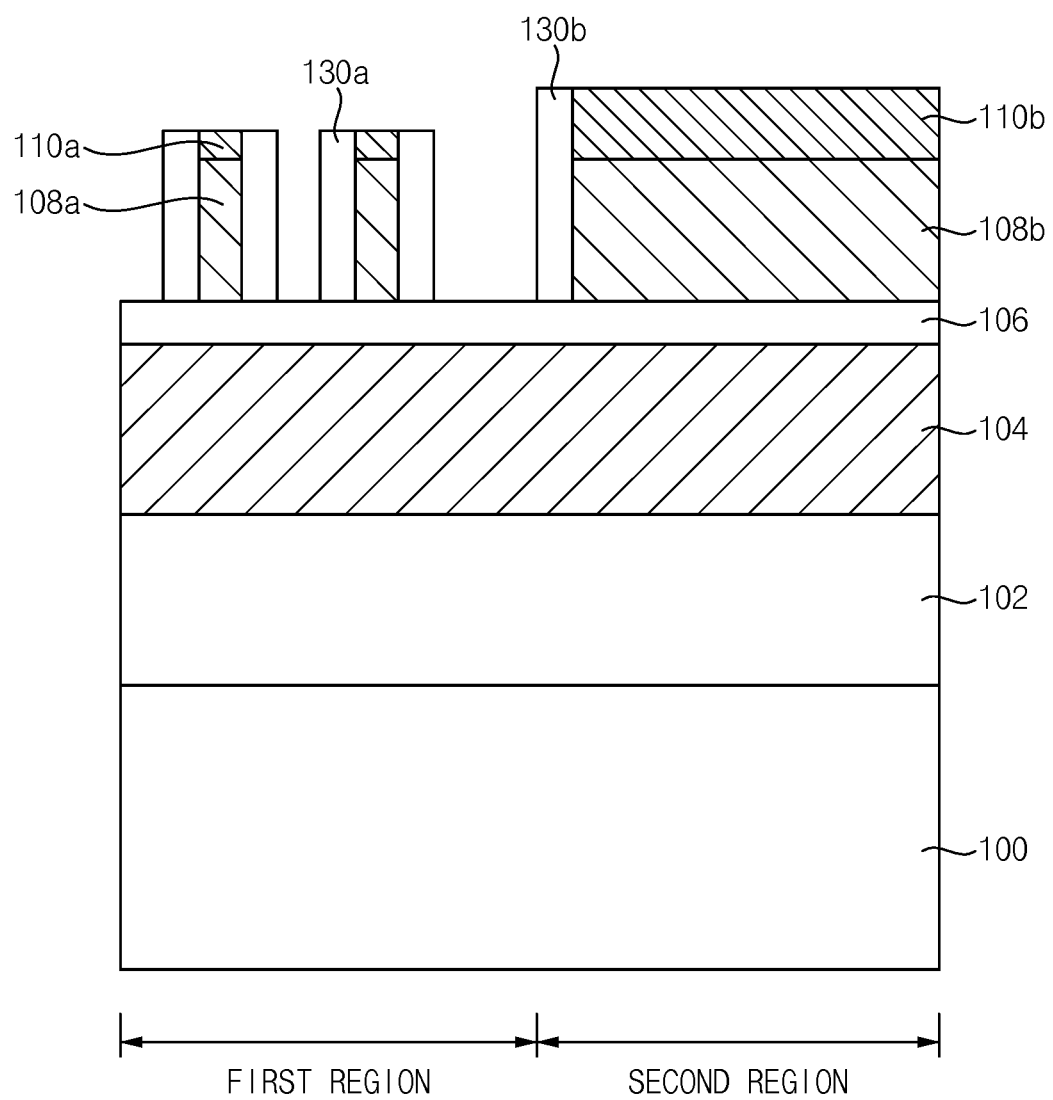

Referring to FIG. 7, the second spacer layer 130 may be anisotropically etched to form a second spacer 130a on side walls of the third mandrel pattern 108a and the third separation layer pattern 110a. Therefore, in the first region, the buffer layer 106 may be exposed between the second spacers 130a.

In addition, the second spacer layer 130 on the fourth mandrel pattern 108b and the fourth separation layer pattern 110b in the second region may be removed in the anisotropic etching process. In this case, a side wall spacer 130b may partially remain on one side walls of the fourth mandrel pattern 108b and the fourth separation layer pattern 110b located at a boundary portion between the first region and the second region.

A bottom surface of the second spacer 130a may contact the buffer layer 106. Therefore, the bottom surface of the second spacer 130a may not contact the second mask layer 104, which is the etching target layer.

Figure 8:
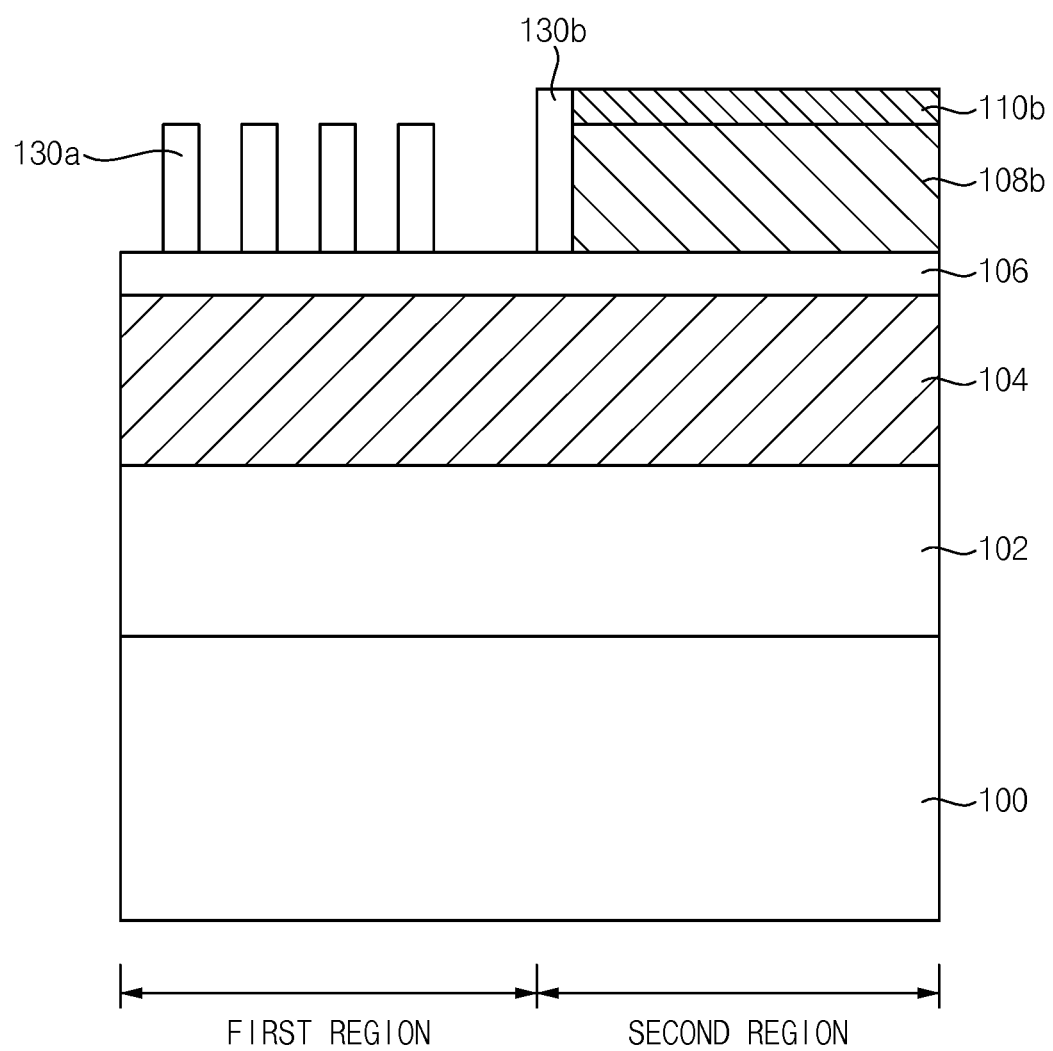

Referring to FIG. 8, the entire third separation layer pattern 110a may be removed while the fourth separation layer pattern 110b remains.

Since the third separation layer pattern 110a is thinner than the fourth separation layer pattern 110b, the entire third separation layer pattern 110a may be removed, and the fourth separation layer pattern 110b may be partially removed.

Thereafter, the third mandrel pattern 108a may be selectively removed. In this case, since the fourth separation layer pattern 110b covers the fourth mandrel pattern 108b on the second region, the fourth mandrel pattern 108b may remain without being removed. The process of removing the third mandrel pattern 108a may include an ashing process. Therefore, the second spacers 130a formed on the first region may each have the first line width while being spaced apart from each other by the first line width.

As described above, the second spacer 130a may contact the buffer layer 106. In this case, the buffer layer 106 may include or may be formed of at least a material having lower electrical conductivity than the second mask layer (e.g., polysilicon). The buffer layer 106 may include or may be formed of the same material as the second spacer 130a.

As a comparative example, when the bottom surface of the second spacer contacts the second mask layer provided as the etching target layer without using a buffer layer disposed therebetween, a defect in which the second spacer is bent or collapses may occur in the process of removing the third mandrel pattern. For example, after the third mandrel pattern supporting the second spacer is removed, the second spacer may bend or collapse. The second spacer may be bent in a direction toward a portion from which the third mandrel pattern is removed by a strong electric field generated as the second mask layer has high electrical conductivity.

However, when the buffer layer 106 is included, an electromagnetic force generated from the high electrical conductivity of the second mask layer may be suppressed. Therefore, when the buffer layer 106 is provided, a defect such as bending of the second spacer 130a in the direction toward the portion from which the third mandrel pattern is removed may be reduced in the process of removing the third mandrel pattern 108a. Therefore, a mask pattern formed by using the second spacer 130a as an etching mask may have an excellent side wall profile.

The second spacer 130a formed on the first region may have the first line width and have a line shape extending in the third direction. The second spacers 130a may be spaced apart from each other at an interval that is equal to the first line width.

Figure 9:
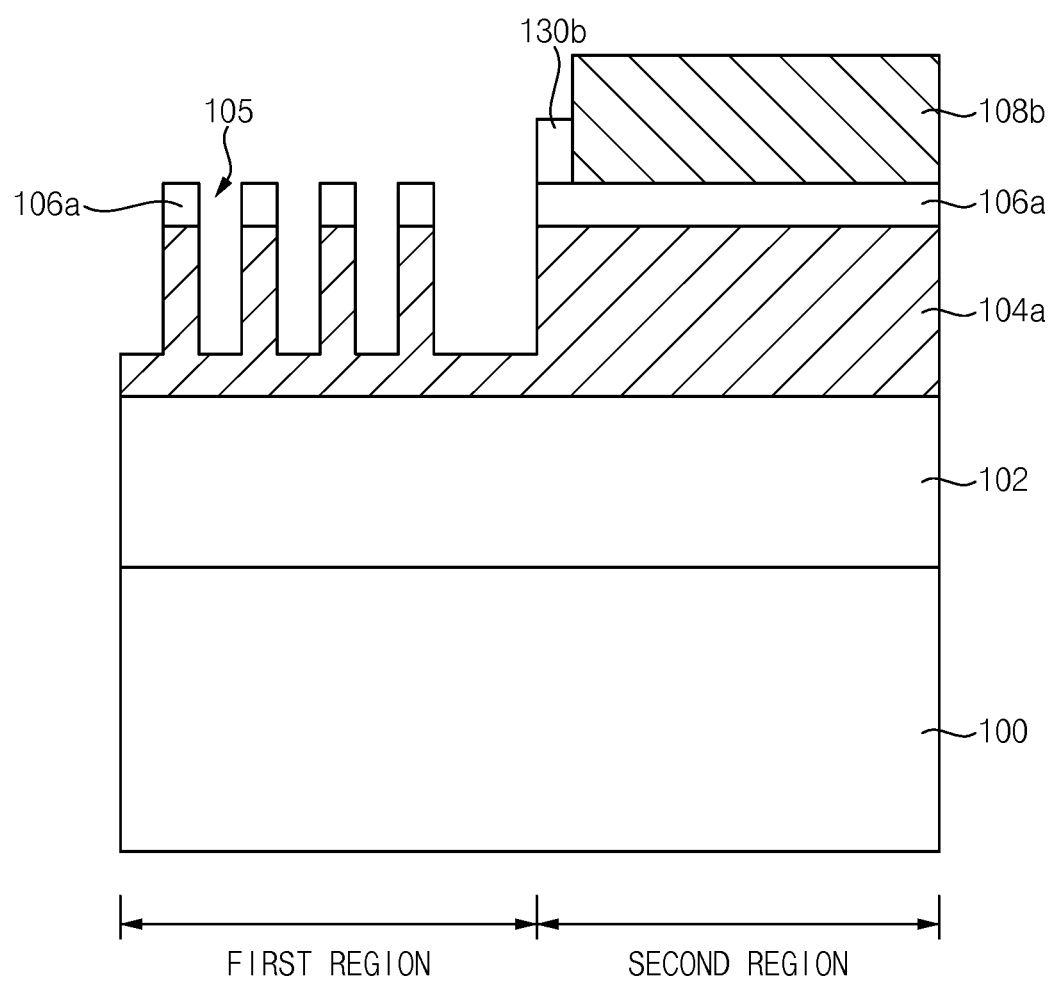

Referring to FIG. 9, the buffer layer 106 that is exposed may be anisotropically etched by using the second spacer 130a, the fourth mandrel pattern 108b, the fourth separation layer pattern 110b, and the side wall spacer 130b as an etching mask to form a buffer layer pattern 106a. The second spacer 130a and the side wall spacer 130b may also be etched by a partial thickness in the process of etching the buffer layer 106.

Subsequently, a portion of the second mask layer 104 may be etched by using the second spacer 130a, the fourth mandrel pattern 108b, the fourth separation layer pattern 110b, and the side wall spacer 130b as an etching mask to form a preliminary second mask pattern 104a on the first region. The first mask layer 102 may not be exposed at a bottom surface of a preliminary opening 105 formed between the preliminary second mask patterns 104a. In other words, the preliminary opening 105 may not extend through the second mask layer 104.

When the etching process is performed, the fourth separation layer pattern 110b may also be removed. In addition, a portion of the fourth mandrel pattern 108b may also be removed. Although the entire second spacer 130a has been shown in the drawing as being removed, after the process is performed, the second spacer 130a may remain by a partial thickness on the buffer layer pattern 106a in the first region.

Figure 10:
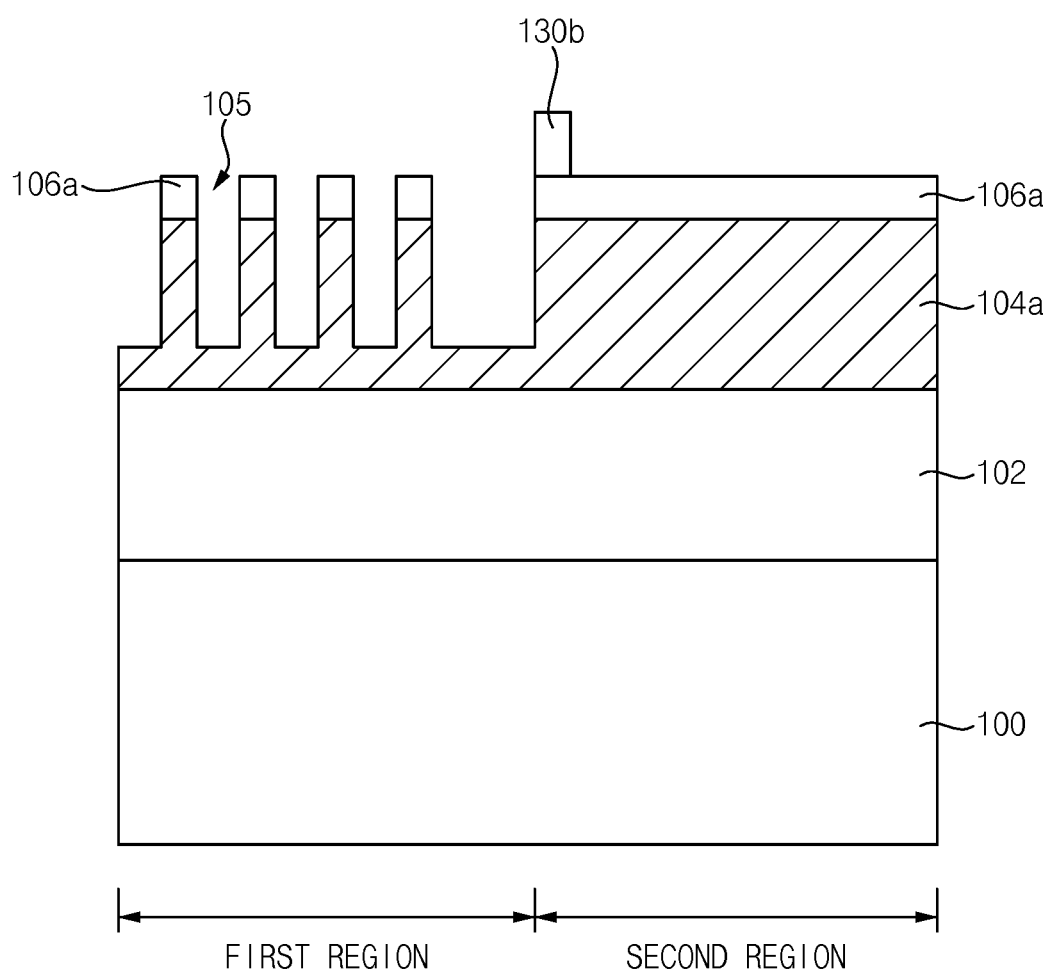

Referring to FIG. 10, the fourth mandrel pattern 108b may be removed. The process of removing the fourth mandrel pattern 108b may include an ashing process. The process of removing the fourth mandrel pattern 108b may be performed in situ with the etching process as described with reference to FIG. 9.

Therefore, the buffer layer pattern 106a may be provided on top surfaces of the preliminary second mask patterns in the first region. In addition, the buffer layer pattern 106a covering the second mask layer 104 may be provided on the second mask layer 104 in the second region.

Referring to FIGS. 11 and 12, the preliminary second mask patterns 104a may be further etched by using the buffer layer pattern 106a as an etching mask, so that a second mask pattern 104b may be formed on the first region and the second region. A top surface of the first mask layer 102 may be exposed through an opening 105a formed between the second mask patterns 104b.

The additional etching process may be performed in situ with the process of removing the fourth mandrel pattern 108b.

As shown in the drawings, the buffer layer pattern 106a having at least a partial thickness may remain on the second mask pattern 104b on the first region and the second region. In addition, a side wall spacer may partially remain on the second mask pattern at a boundary portion between the first region and the second region.

As described above, an etching process may be performed by using the buffer layer pattern 106a, which is the same etching mask, as an etching mask on the first region and the second region in a final etching process for forming the second mask pattern 104b on the first region and the second region. Therefore, each of the openings 105a may extend through an etching process with high etching selectivity. Thus, the second mask layer may be sufficiently etched to form the opening 105a, which is target, in the second mask layer. Therefore, defects of the second mask pattern 104b may be reduced.

Meanwhile, since the buffer layer pattern 106a on the first region is rapidly consumed due to a three-dimensional effect when the etching process is performed, the buffer layer pattern 106a on the first region may be thinner than the buffer layer pattern 106a on the second region.

In addition, in the etching process, a side wall spacer may partially remain on an edge portion of the second region, which is a boundary between the first region and the second region. Since the side wall spacer is provided as an additional etching mask, the etching mask may be relatively thick on the edge portion of the second region. A layer at the edge portion of the second region may be etched faster than other portions of the second region, so that defects such as over-etching of the layer may occur. However, as described above, since the etching mask at the edge portion of the second region is relatively thicker in the etching process, defects in which the second mask layer is over-etched may be reduced.

Meanwhile, when the buffer layer pattern is not further provided, etching may be performed in the first region by using the second spacer as an etching mask, and the second mask layer may be etched in the second region by using the fourth mandrel pattern as an etching mask. In this case, during the etching process, carbon included in the fourth mandrel pattern may be partially removed to generate a polymer, which may interfere with the etching. Therefore, an etching rate may be locally slowed. Accordingly, each of the openings formed between the second mask patterns 104b may not have a target depth, so that the first mask layer located under each of the openings may not be exposed.

Referring to FIGS. 13 and 14, a spin-on hard mask layer 132 covering the second mask pattern 104b may be formed. A third separation layer 134 may be formed on the spin-on hard mask layer 132. The third separation layer 134 may include or may be formed of silicon oxynitride.

A fourth photoresist pattern 136 may be formed on the third separation layer 134. The fourth photoresist pattern 136 may include an opening 137 for selectively exposing a portion of the second mask pattern 104b to be cut in order to form a first active pattern on the substrate in the first region. In addition, a portion to be formed into a second device separation pattern may be selectively exposed at the second region.

Referring to FIGS. 15 and 16, the third separation layer 134 may be anisotropically etched by using the fourth photoresist pattern 136 as an etching mask. Subsequently, the spin-on hard mask layer 132 may be anisotropically etched. In addition, the buffer layer pattern 106a and the second mask pattern 104b, which are exposed, may be anisotropically etched. Therefore, a third mask pattern 104c may be formed on the substrate in the first region and the second region.

Thereafter, the fourth photoresist pattern 136 and the third separation layer 134 may be removed. In addition, the spin-on hard mask layer 132 may be removed through an ashing process.

Figure 17:
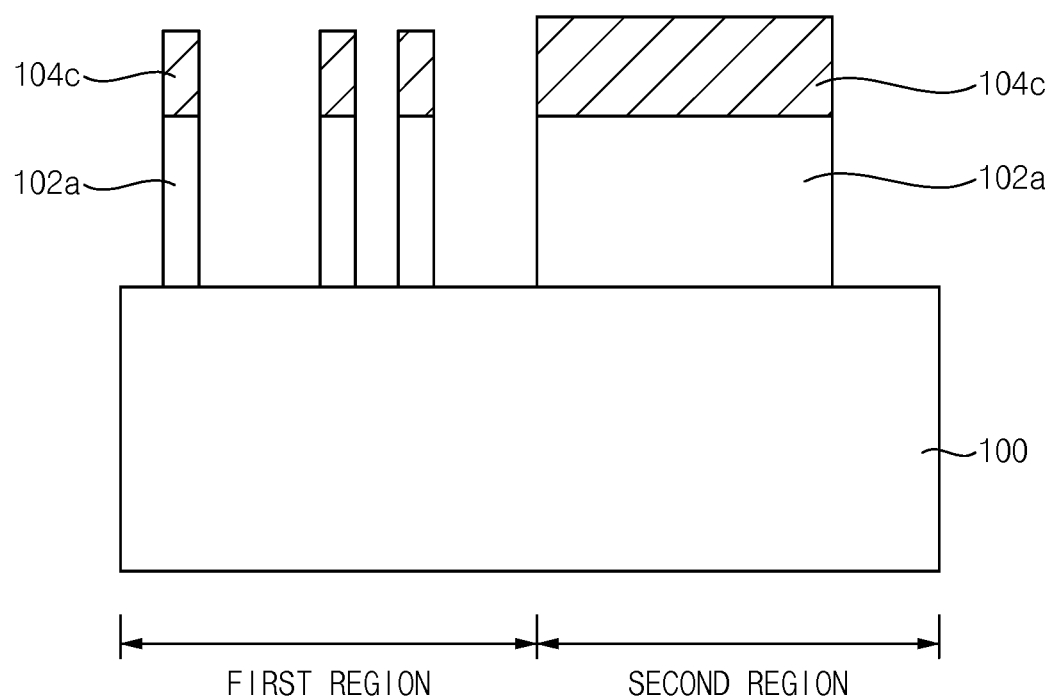

Referring to FIG. 17, the first mask layer 102 may be etched by using the buffer layer pattern 106a and the third mask pattern 104c as an etching mask to form a first mask pattern 102a.

The first mask pattern 102a on the first region may cover a portion in which the first active pattern is to be formed. The first mask pattern 102a on the second region may cover a portion in which a second active pattern that is wider than the first active pattern is to be formed.

During the etching process, both the buffer layer pattern 106a and the side wall spacer 130b may be removed. In addition, the third mask pattern 104c may be removed by a partial thickness.

Figure 18:
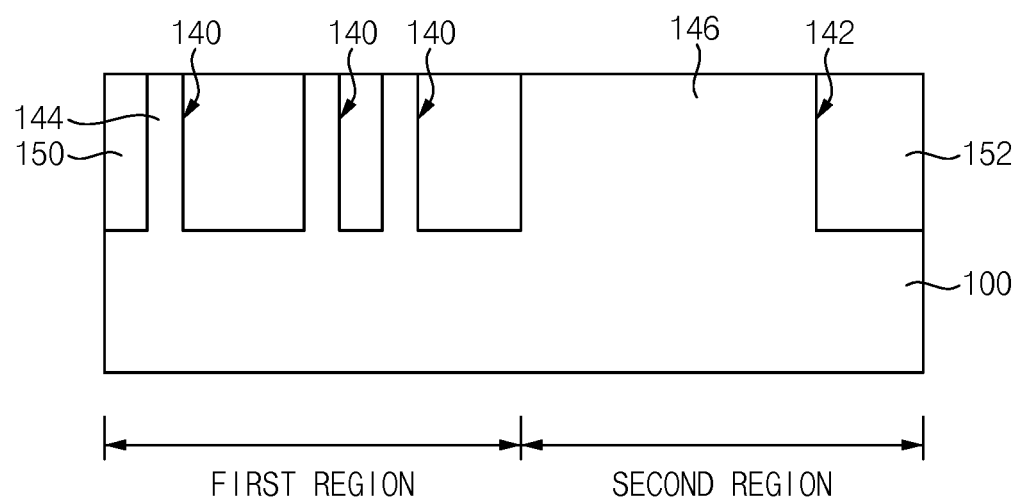

Referring to FIG. 18, an upper portion of the substrate 100 may be etched by using the first mask pattern 102a and the third mask pattern 104c as an etching mask. Therefore, a first trench 140 and a first active pattern 144 may be formed in the substrate in the first region. A second trench 142 and a second active pattern 146 may be formed in the substrate in the second region.

Thereafter, the first and second trenches 140 and 142 may be filled with an insulating material and planarized, so that a first device separation pattern 150 and a second device separation pattern 152 may be formed in the first and second trenches 140 and 142, respectively.

The above processes may be performed to form active patterns of a semiconductor device. As described above, since the second spacer may be prevented from being bent, the second mask pattern formed under the second spacer may have an excellent side wall profile. Accordingly, the active patterns that are finally formed may have excellent side wall profiles. In addition, the second mask layer under the second spacer may be finally etched by using the buffer layer pattern as an etching mask to form the second mask pattern 104b. As described above, since the second mask layer on the first region and the second region is etched by using the same etching mask, defects of the second mask pattern may be reduced.

Thereafter, although not shown in the drawings, memory cells, each including a gate structure, a bit line structure, contact plugs, and a capacitor, may be formed on the first active pattern and the first device separation pattern in the first region. The memory cell may be a DRAM cell. In addition, a transistor and a wire constituting a peripheral circuit may be formed on the second active pattern and the second device separation pattern in the second region.

In the above description, a method for forming first and second active patterns in a first region and a second region through a quadruple patterning technique (QPT) process, respectively, has been disclosed. However, the method for forming the first and second active patterns is not limited thereto, and may be formed, for example, through a double patterning technique (DPT) process.

FIGS. 19 to 28 are sectional views showing a method for manufacturing a semiconductor device according to an exemplary embodiment.

A method for manufacturing a semiconductor device, which will be described below, may be identical or similar to the method for manufacturing the semiconductor device as described with reference to FIGS. 1 to 18 except for a stacked structure of the mask layer structure. Therefore, redundant descriptions thereof will be omitted or simplified.

Figure 19:
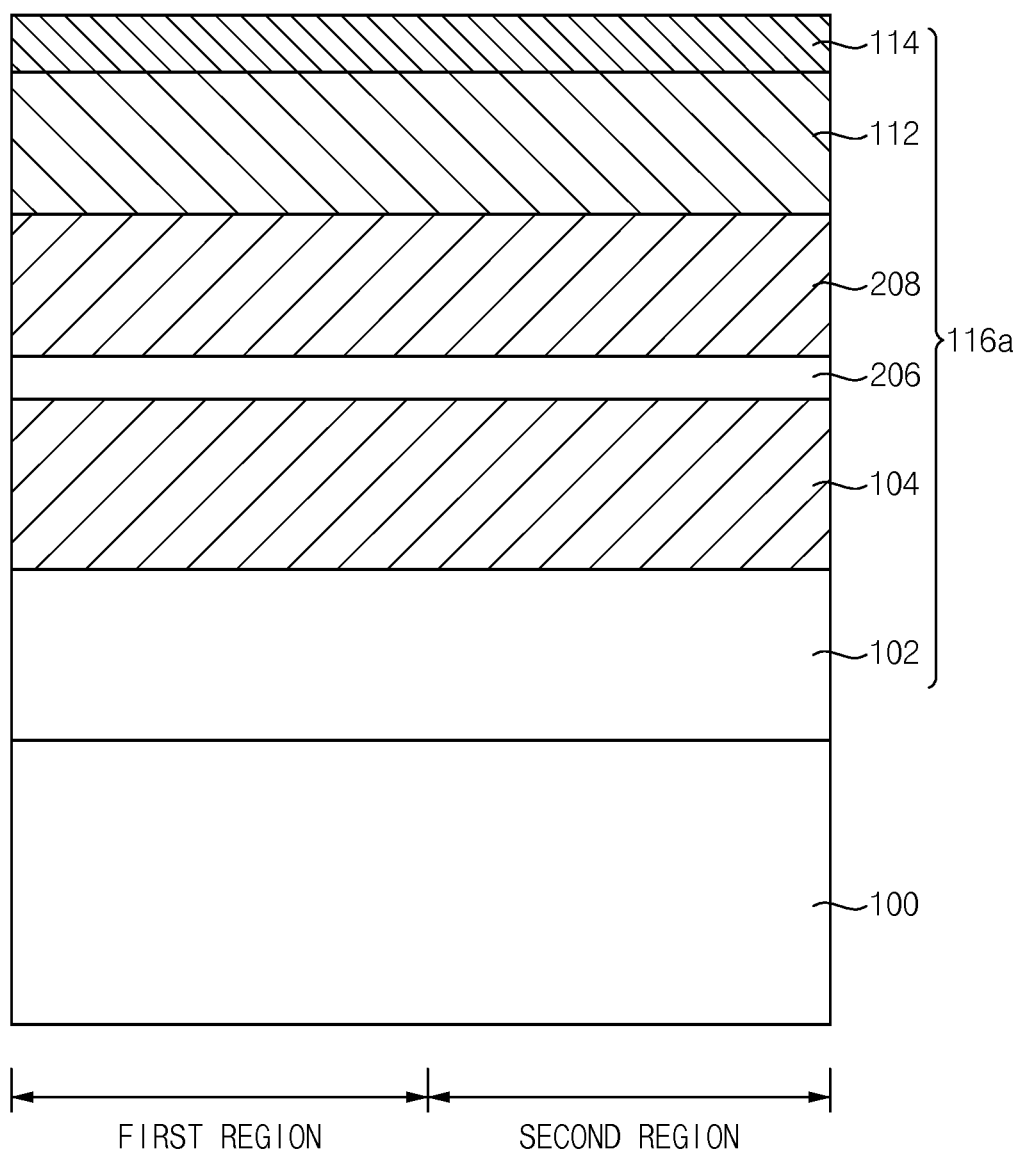
FIGS. 19 to 28 are sectional views showing a method for manufacturing a semiconductor device according to an exemplary embodiment.

Referring to FIG. 19, a mask layer structure 116a in which layers provided as etching mask layers are stacked may be formed on the substrate 100 in the first region and the second region.

The mask layer structure 116a may include at least one mask layer 102 and 104, a buffer layer 206, a first mandrel layer 208, and a second mandrel layer 112.

According to an exemplary embodiment, the mask layer structure 116a may be configured such that a first mask layer 102, a second mask layer 104, the buffer layer 206, the first mandrel layer 208, the second mandrel layer 112, and a separation layer 114 are sequentially stacked.

The first mask layer 102 may be provided as a mask layer for finally etching the substrate. The first mask layer 102 may include or may be, for example, a silicon oxide layer. The second mask layer 104 may be provided to pattern the first mask layer 102. The second mask layer 104 may include or may be formed of, for example, polysilicon.

The buffer layer 206 may include or may be formed of the same material as the second spacer formed on the side wall of the first mandrel pattern or a material having electrical conductivity that is identical or similar to electrical conductivity of the second spacer in a subsequent process. The second spacer may be provided as an etching mask for patterning the second mask layer. According to the exemplary embodiment, the buffer layer 206 may include or may be formed of a material having lower electrical conductivity than the second mask layer (e.g., polysilicon) located under the buffer layer 206.

In addition, the buffer layer 206 may be provided as a portion of an etching mask for etching the second mask layer 104 located under buffer layer 206. Therefore, the buffer layer 206 may include or may be formed of a material having etching selectivity with respect to the second mask layer 104.

As one example, the second spacer may include or may be formed of silicon oxide. In this case, the buffer layer 206 may include or may be formed of silicon oxide or silicon oxynitride, which is an insulating material including a silicon-oxygen bond. Hereinafter, an example in which the second spacer includes or is formed of silicon oxide, and the buffer layer 206 is formed of silicon oxynitride will be described.

The buffer layer 206 may be formed between the second mask layer 104 and the first mandrel layer 208.

The first mandrel layer 208 may include or may be formed of a material having etching selectivity with respect to the second spacer. In addition, since the first mandrel layer 208 is a sacrificial layer used to form the second spacer, the first mandrel layer 208 may include or may be formed of a material that may be easily removed.

Since the buffer layer 206 is provided between the second mask layer 104 and the first mandrel layer 208, even when the second mask layer 104 and the first mandrel layer 208 are formed of the same material, the second mask layer 104 and the first mandrel layer 208 may be separated from each other by the buffer layer 206. Therefore, according to the exemplary embodiment, the first mandrel layer 208 may be formed of the same material as the second mask layer 104, which is a layer (i.e., an etching target layer) that is etched by using the second spacer as an etching mask.

As one example, the second mask layer 104 and the first mandrel layer 208 may include or may be formed of polysilicon. As described above, restrictions on materials that may be used to form the first mandrel layer 208 may be reduced. When the first mandrel layer 208 includes or is formed of polysilicon, a subsequent patterning process may be easily performed.

The second mandrel layer 112 may include or may be formed of a spin-on hard mask material. The separation layer 114 may include or may be formed of silicon oxynitride. The separation layer 114 may have a thickness that is thinner than a thickness of the second mandrel layer 112.

As described above, the first and second mandrel layers 208 and 112 may include or may be formed of mutually different materials. In this case, since it is not necessary to separate the first and second mandrel layers 208 and 112 from each other, the first separation layer may not be formed on the first mandrel layer 208. Therefore, a stacked structure of the mask layer structure 116a may be simplified.

Figure 20:
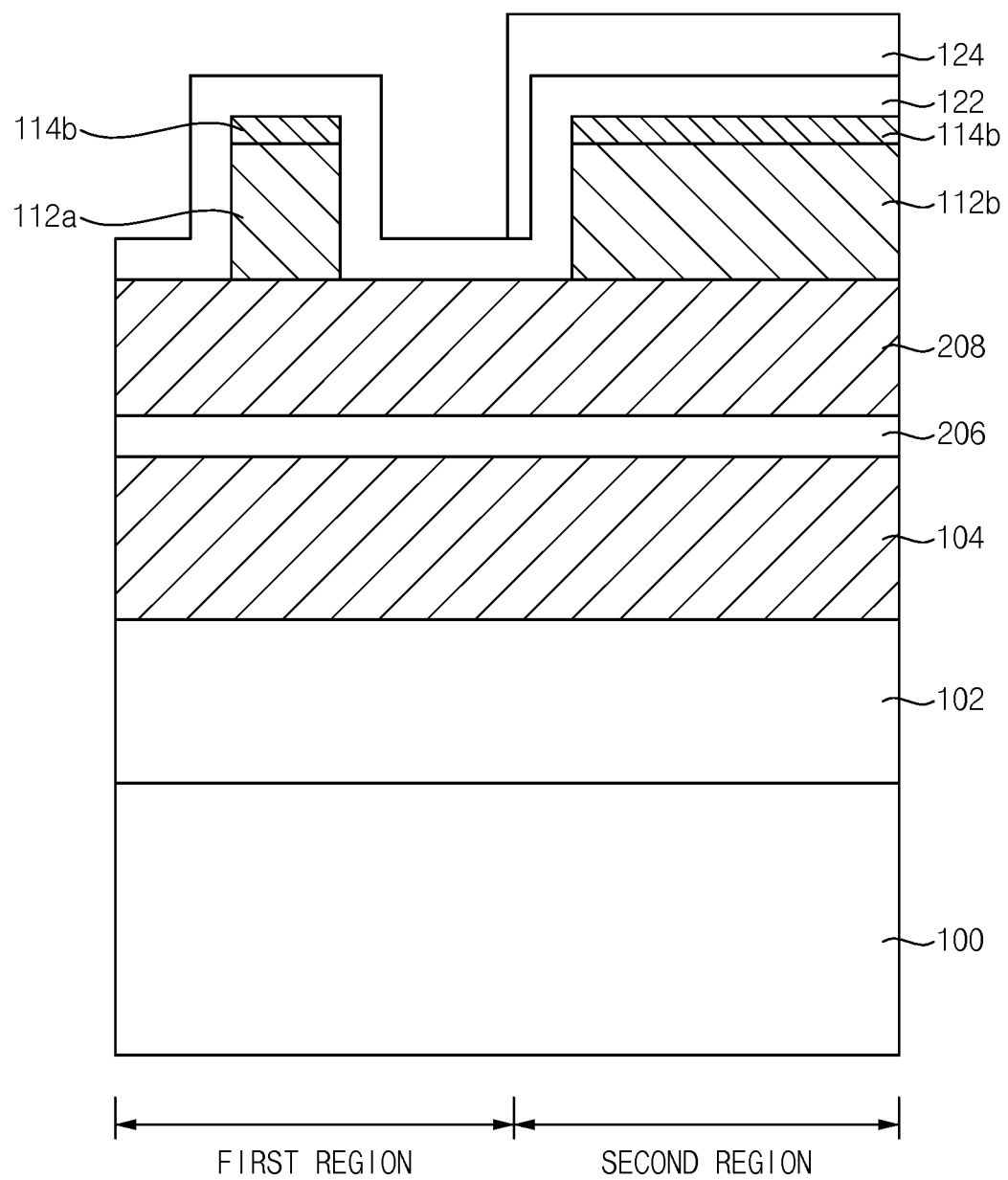

Referring to FIG. 20, first and second photoresist patterns 120a and 120b may be formed on the mask layer structure 116a in the first region and the second region, respectively.

The separation layer 114 and the second mandrel layer 112 may be sequentially etched by using the first and second photoresist patterns 120a and 120b as an etching mask. Therefore, a first mandrel pattern 112a and a first separation layer pattern 114a may be formed on the first mandrel layer 208 in the first region, and a second mandrel pattern 112b and a second separation layer pattern 114b may be formed on the first mandrel layer 208 in the second region.

Thereafter, the first and second photoresist patterns 120a and 120b may be removed.

A first spacer layer 122 may be conformally formed on the first mandrel pattern 112a, the first separation layer pattern 114a, the second mandrel pattern 112b, the second separation layer pattern 114b, and the first mandrel layer 208.

A third photoresist pattern 124 may be formed on the first spacer layer 122. The third photoresist pattern 124 may cover the first spacer layer 122 formed on surfaces of the second mandrel pattern 112b and the second separation layer pattern 114b.

The processes described above may be substantially the same as the processes described with reference to FIGS. 2 and 3.

Figure 21:
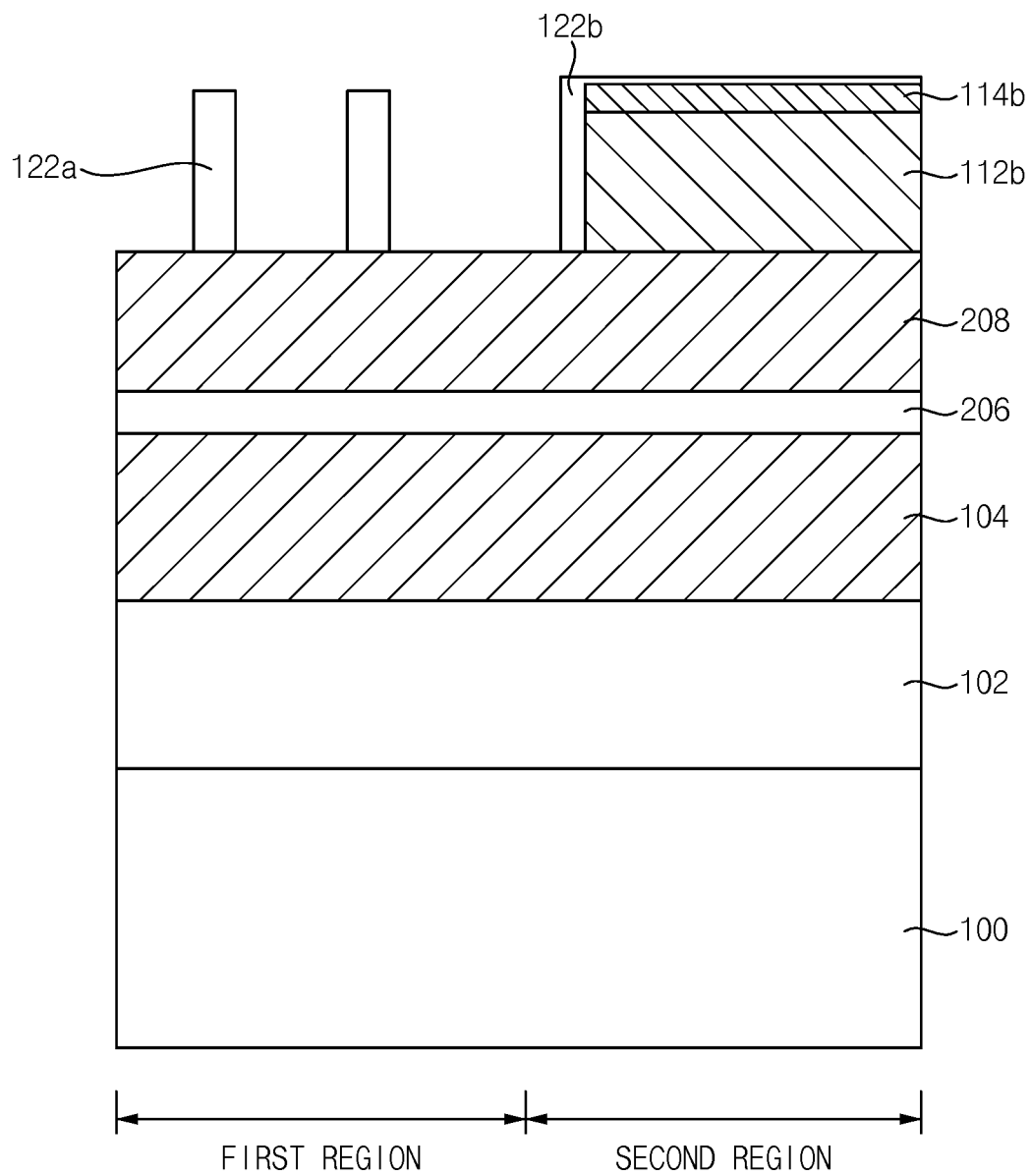

Referring to FIG. 21, the first spacer layer 122 may be anisotropically etched to form a first spacer 122a on side walls of the first mandrel pattern 112a and the first separation layer pattern 114a.

In this case, since the first spacer layer 122 on the second region is masked by the third photoresist pattern, the first spacer layer may cover surfaces of the second mandrel pattern 112b and the second separation layer pattern 114b on the second region.

Thereafter, the first separation layer pattern 114a and the first mandrel pattern 112a may be selectively removed. Therefore, the first spacers 122a formed on the substrate in the first region may extend in the third direction while being regularly spaced apart from each other.

The first spacer layer 122 formed on top surfaces of the second mandrel pattern 112b and the second separation layer pattern 114b may be removed. In this case, the first spacer 122a may partially remain on side walls of the second mandrel pattern 112b and the second separation layer pattern 114b at a boundary between the first region and the second region.

Figure 22:
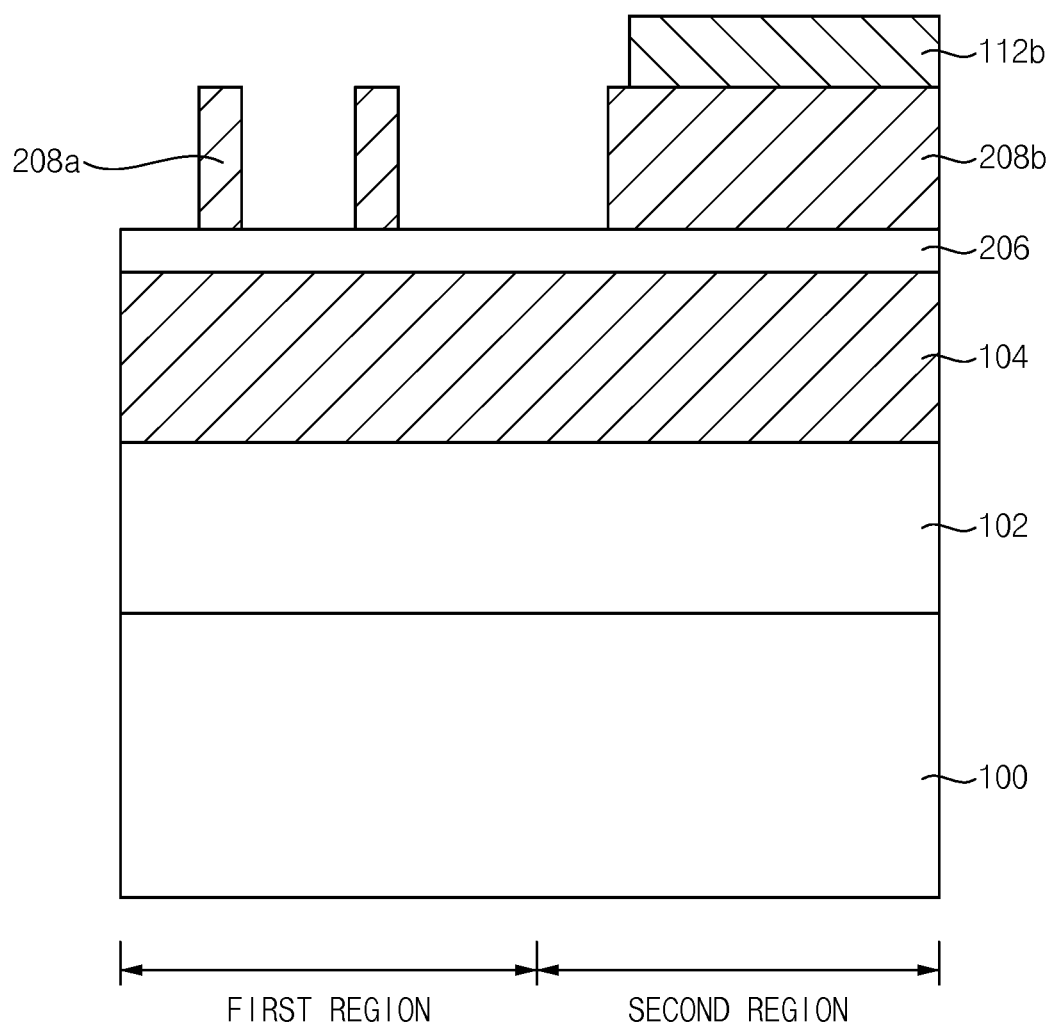

Referring to FIG. 22, the first mandrel layer 208 exposed between the first spacers 122a may be etched by using the first spacers 122a, the second mandrel pattern 112b, and the second separation layer pattern 114b as an etching mask. Therefore, a third mandrel pattern 208a may be formed on the buffer layer 206 in the first region.

When the etching process is performed, the second separation layer pattern 114b and a portion of the second mandrel pattern 112b on the second region may also be removed. Therefore, a structure in which a fourth mandrel pattern 208b and a second mandrel pattern 112b covering the second region are stacked may be formed on the buffer layer 206 in the second region.

Thereafter, all of the remaining first spacers 122a may be removed.

Figure 23:
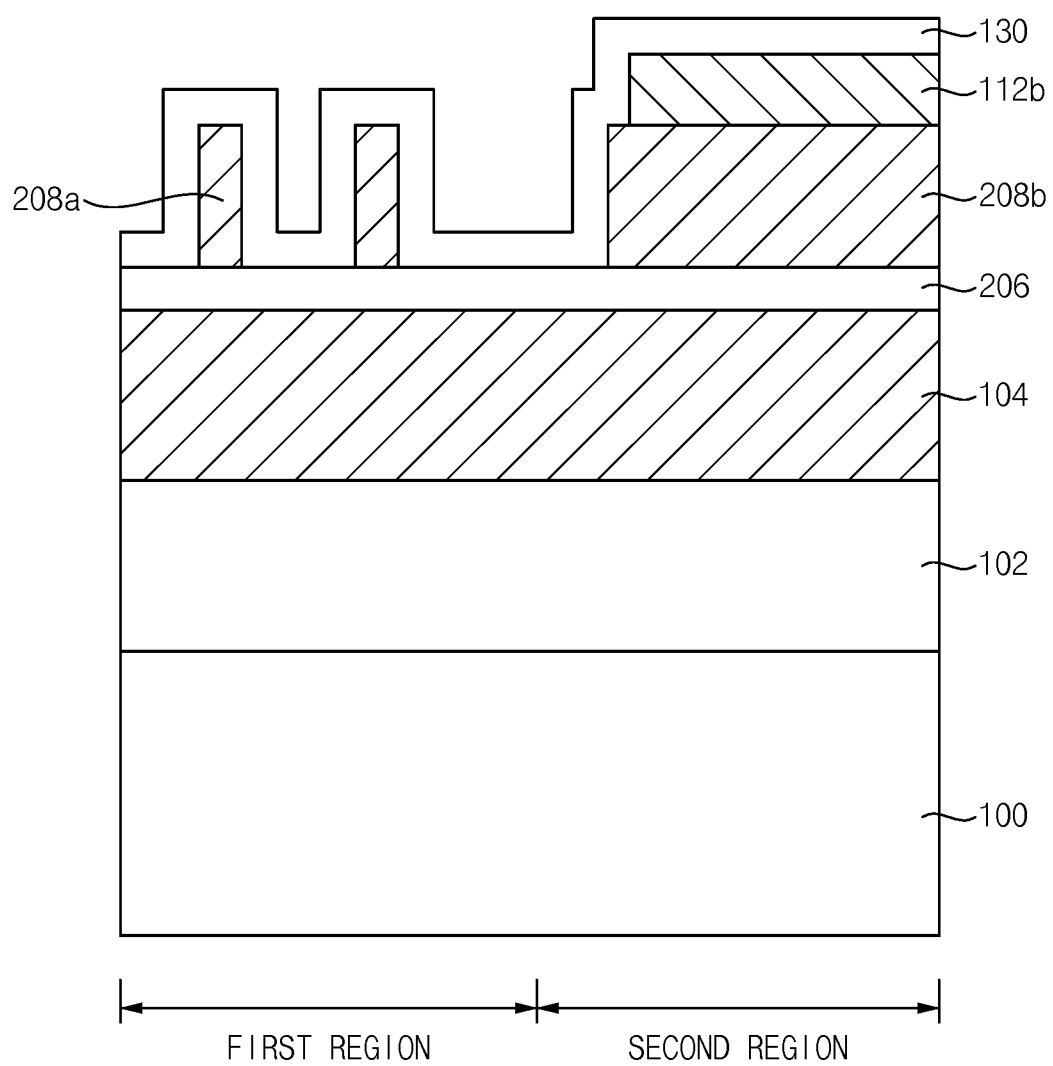

Referring to FIG. 23, a second spacer layer 130 may be conformally formed on the third mandrel pattern 208a, the fourth mandrel pattern 208b, the second mandrel pattern, and the buffer layer 206.

Figure 24:
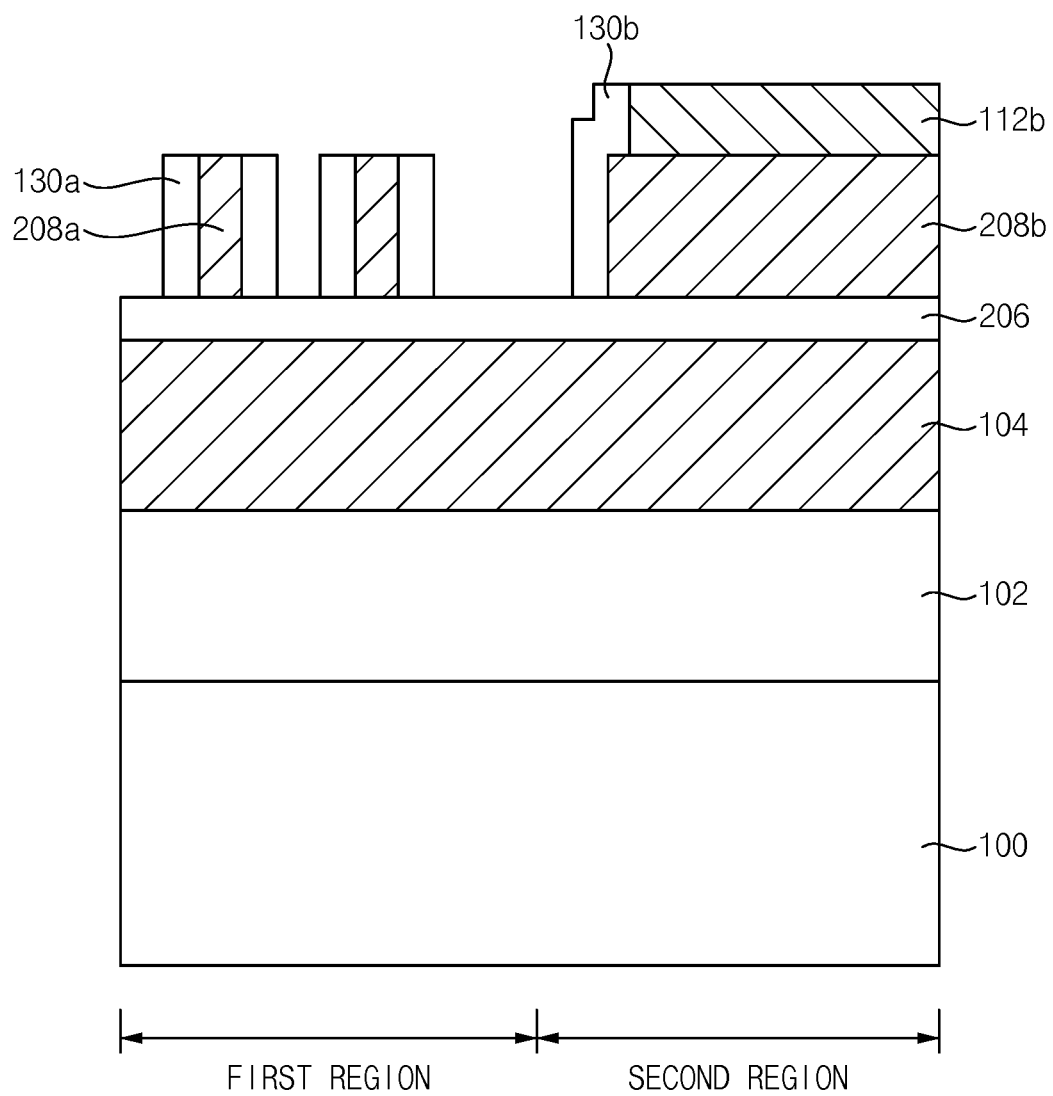

Referring to FIG. 24, the second spacer layer 130 may be anisotropically etched to form a second spacer 130a on a side wall of the third mandrel pattern 208a. Therefore, in the first region, the buffer layer 206 may be exposed between the second spacers.

Meanwhile, a structure in which the fourth mandrel pattern 208b and the second mandrel pattern 112b are stacked may remain on the buffer layer 206 in the second region, and a side wall spacer 130b may partially remain on one side walls of the fourth mandrel pattern 208b and the second mandrel pattern 112b located at a boundary portion between the first region and the second region.

Figure 25:
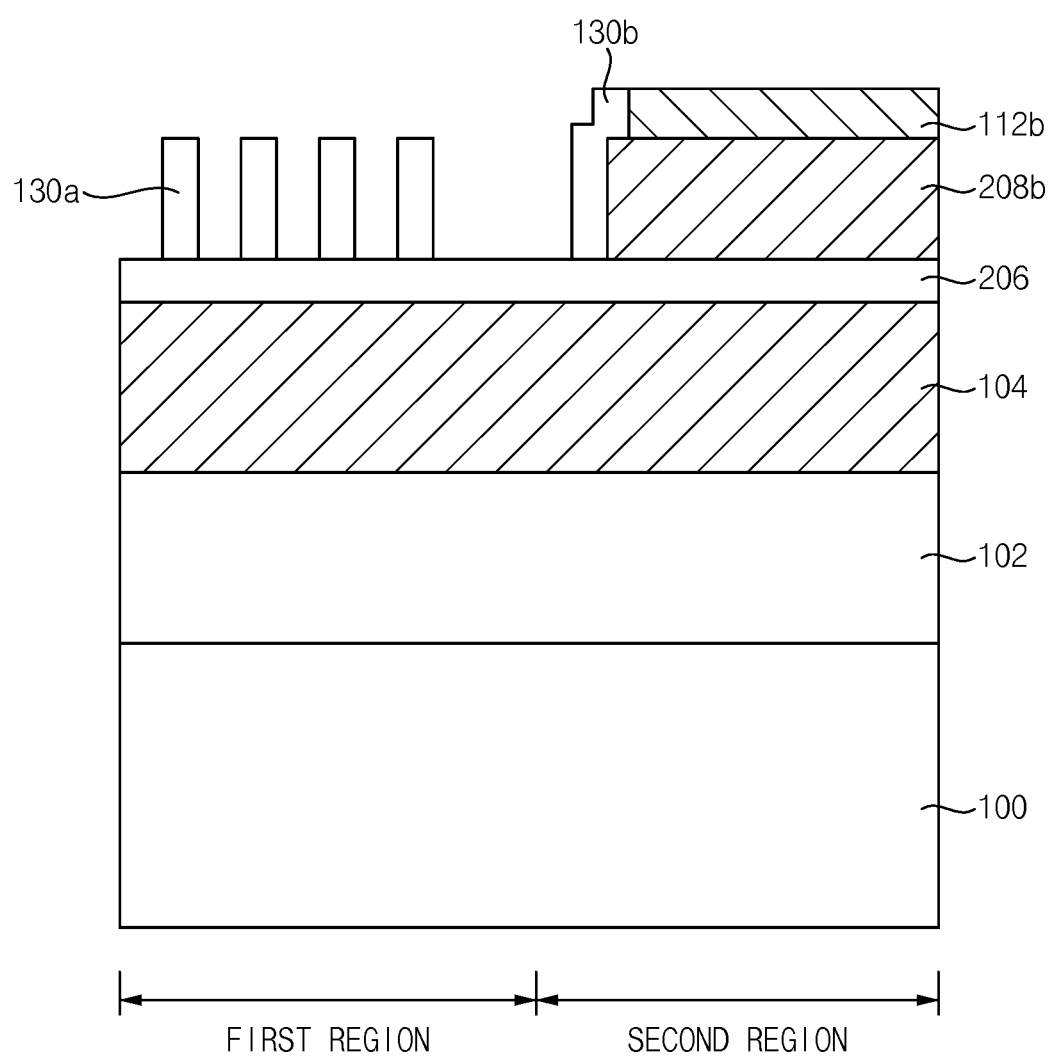

Referring to FIG. 25, the third mandrel pattern 208a on the first region may be removed. In this case, since the second mandrel pattern 112b covers the fourth mandrel pattern 208b on the second region, the fourth mandrel pattern 208b may remain without being removed. The process of removing the third mandrel pattern 208a may include a wet etching process.

The second spacer 130a may contact the buffer layer 206. Therefore, defects such as bending of the second spacer 130a in the process of removing the third mandrel pattern 208a may be reduced.

Figure 26:
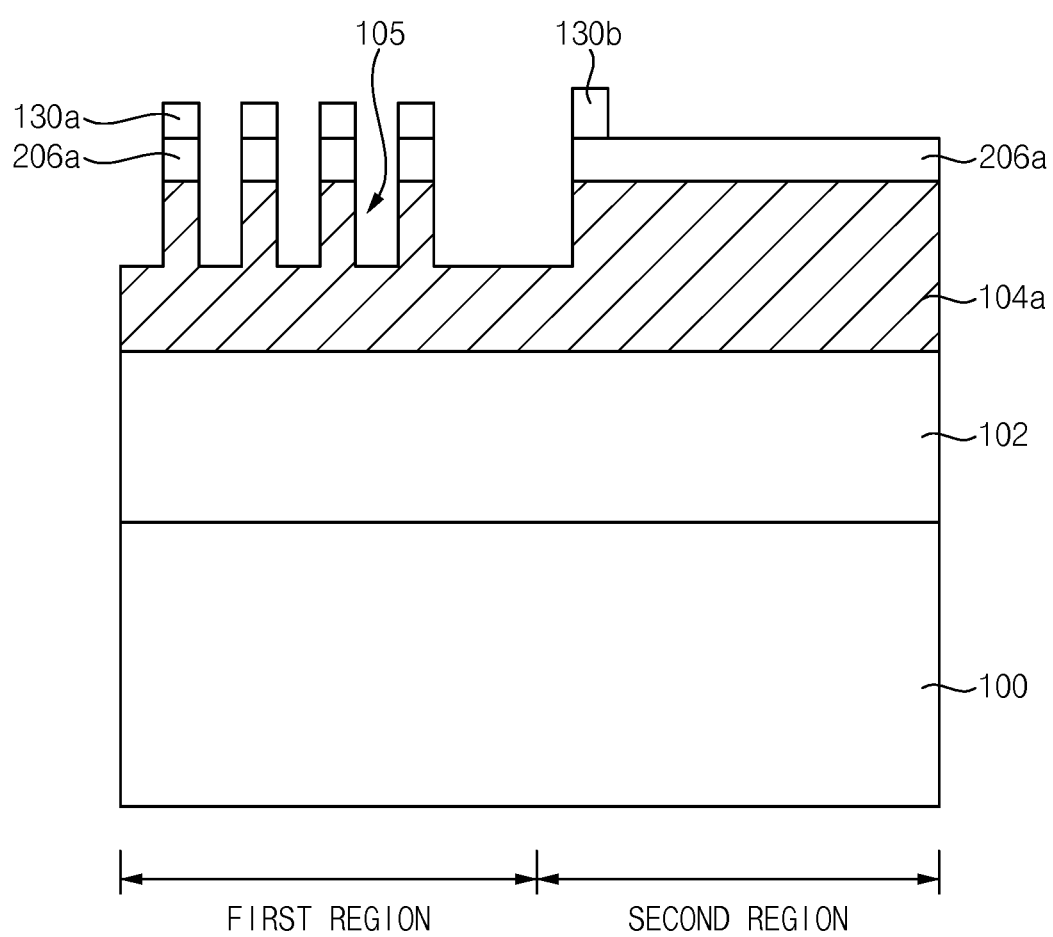

Referring to FIG. 26, the buffer layer 206 that is exposed may be anisotropically etched to form a buffer layer pattern 206a by using the second spacer 130a, the fourth mandrel pattern 208b, the second mandrel pattern 112b, and the side wall spacer 130b as an etching mask. The second spacer 130a and the side wall spacer 130b may also be etched by a partial thickness in the process of etching the buffer layer 206. After the buffer layer is etched, all of the second mandrel patterns may be removed.

Subsequently, a portion of the second mask layer 104 may be etched by using the second spacer 130a, the fourth mandrel pattern 208b, and the side wall spacer 130b as an etching mask to form a preliminary second mask pattern 104a on the first region. The first mask layer 102 may not be exposed at a bottom surface of a preliminary opening 105 formed between the preliminary second mask patterns 104a.

In other words, the preliminary opening 105 may not extend through the second mask layer 104.

When the etching process is performed, the fourth mandrel pattern 208b including the same material as the second mask layer 104 may also be removed. Therefore, the buffer layer pattern 206a may be provided on top surfaces of the preliminary second mask patterns 104a in the second region.

Figure 27:
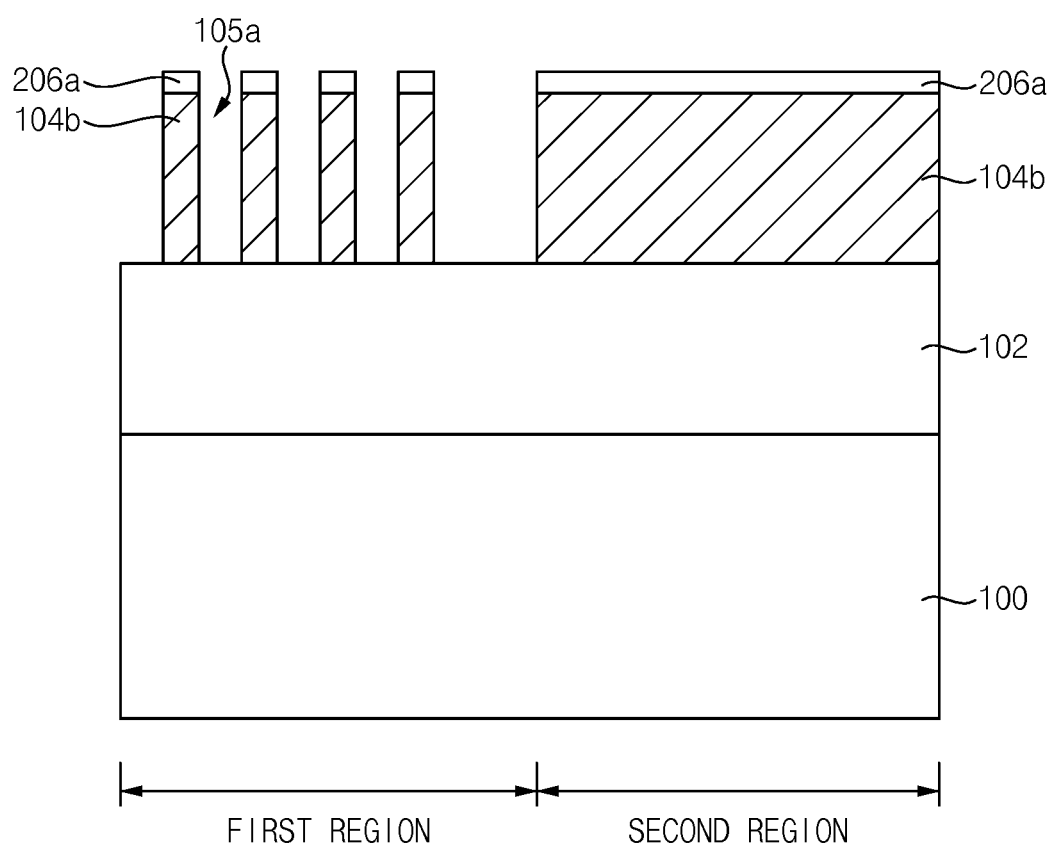

Referring to FIG. 27, the preliminary second mask patterns 104a may be further etched using the buffer layer pattern 206a as an etching mask, so that a second mask pattern 104b may be formed on the first region and the second region. A top surface of the first mask layer 102 may be exposed through the opening 105a formed between the second mask patterns 104b.

As described above, an etching process may be performed by using the buffer layer pattern 206a, which is the same etching mask, as an etching mask on the first region and the second region in a final etching process for forming the second mask pattern 104b on the first region and the second region. Therefore, each of the openings 105a formed using the etching process may have a desired depth.

Figure 28:
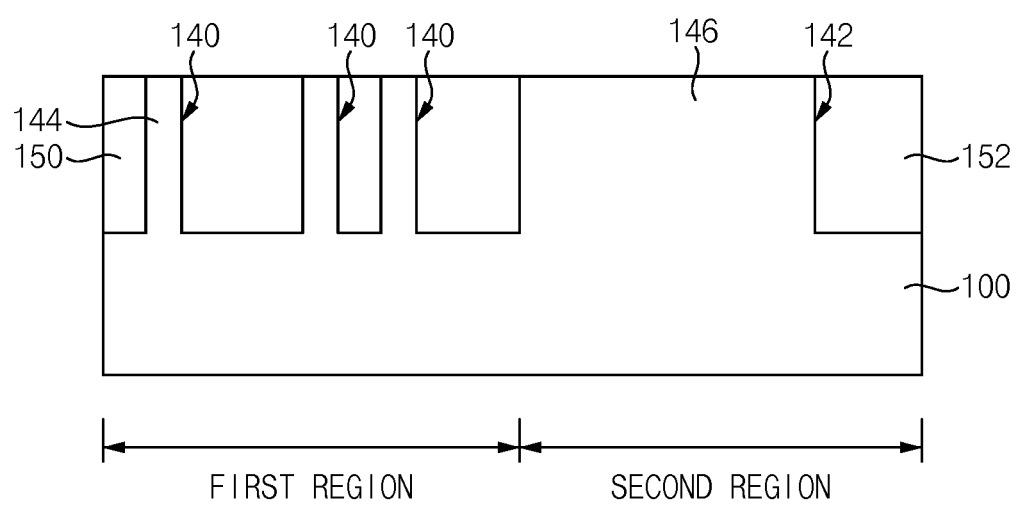

Thereafter, the same processes as described with reference to FIGS. 13 to 18 may be performed. Therefore, as shown in FIG. 28, a first trench 140 and a first active pattern 144 may be formed in the substrate in the first region. A second trench 142 and a second active pattern 146 may be formed in the substrate in the second region.

Hereinafter, a method for forming first and second active patterns in first and second regions, respectively, by performing a double patterning technique (DPT) process will be described.

Figure 29:
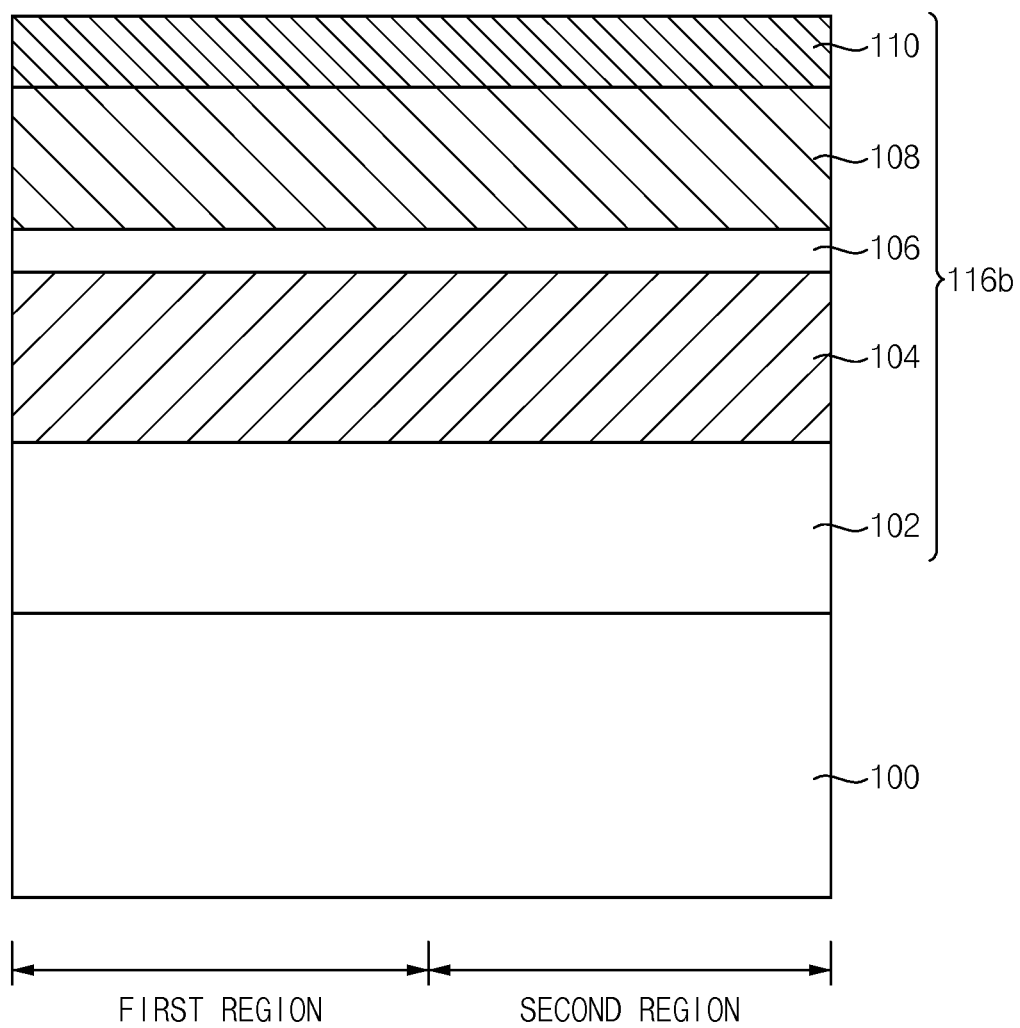
FIGS. 29 to 31 are sectional views showing a method for manufacturing a semiconductor device according to an exemplary embodiment.
Figure 30:
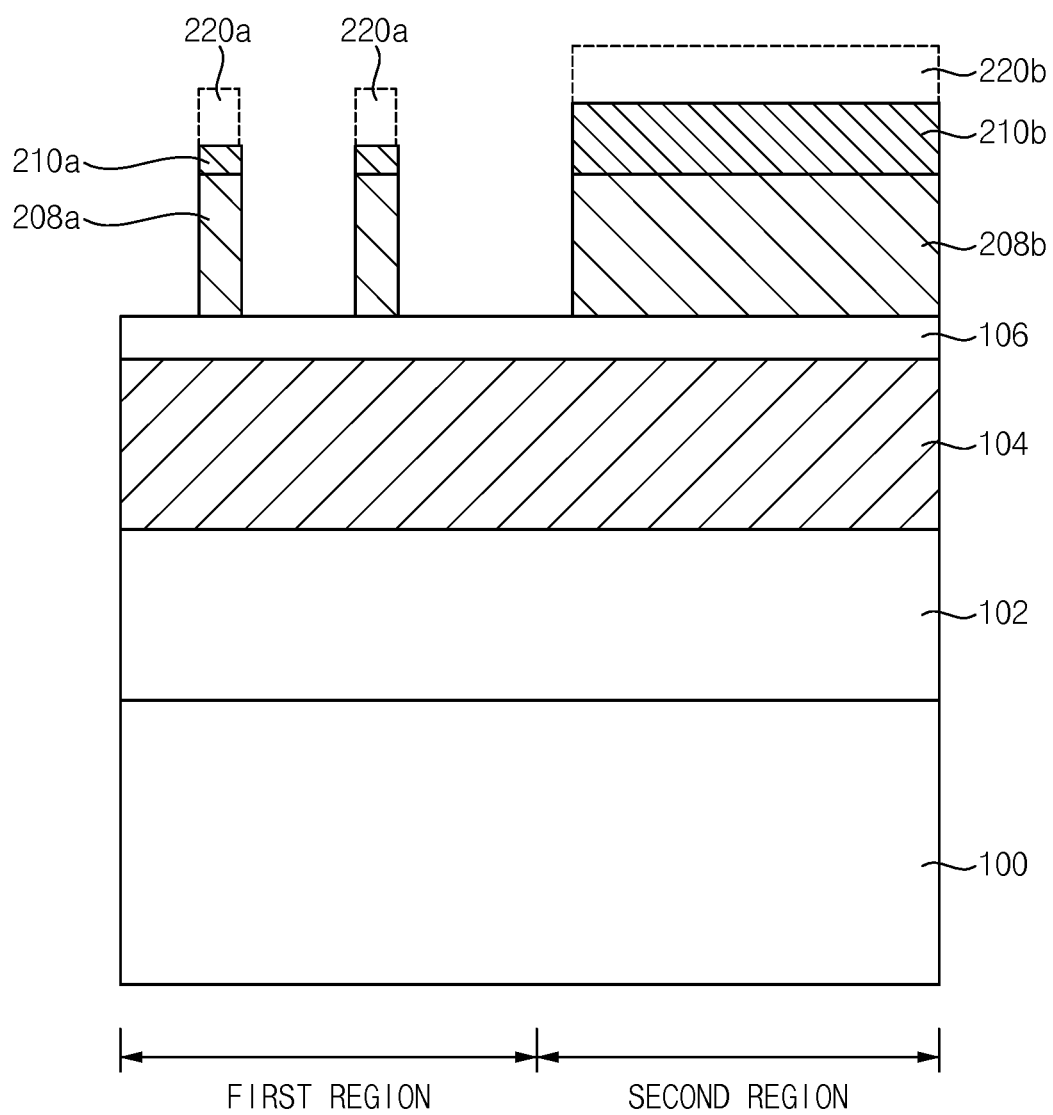
Figure 31:
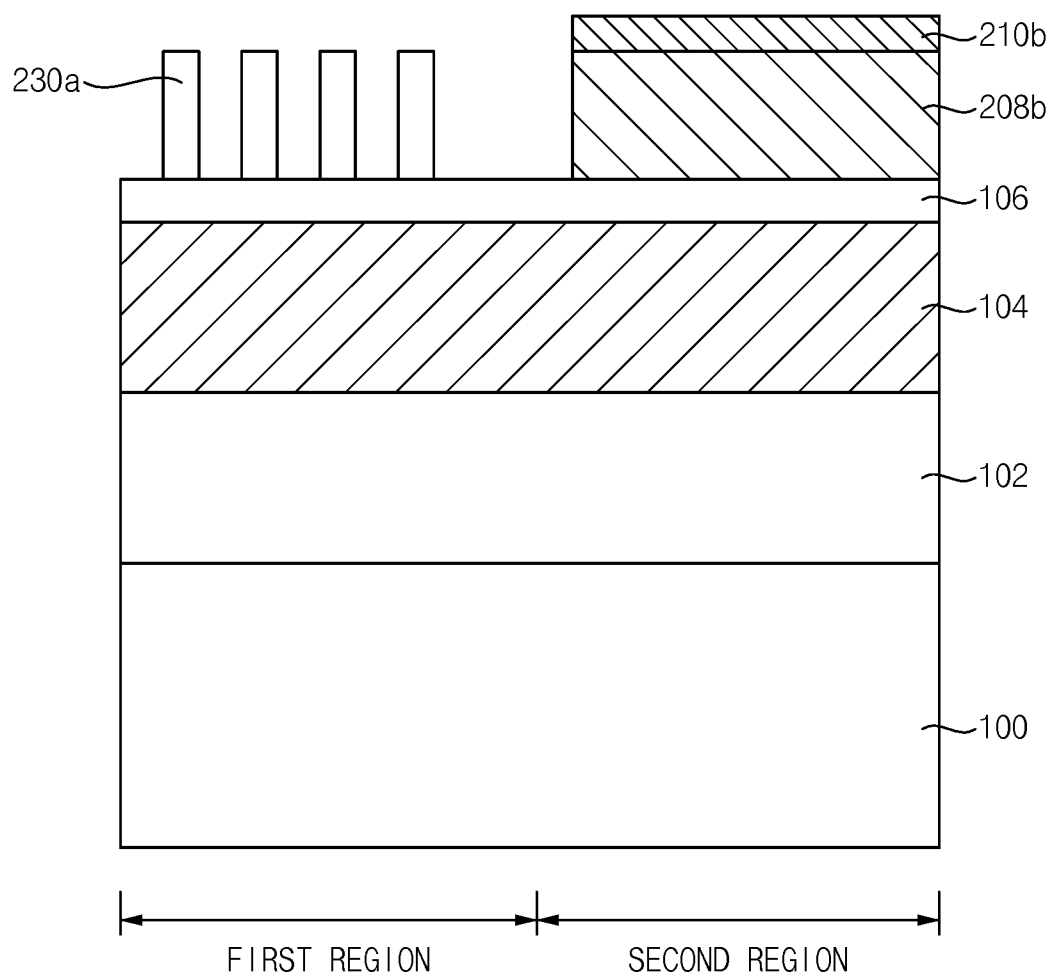

FIGS. 29 to 31 are sectional views showing a method for manufacturing a semiconductor device according to an exemplary embodiment.

Referring to FIG. 29, a mask layer structure 116b in which layers provided as etching mask layers are stacked may be formed on the substrate 100 in the first region and the second region.

The mask layer structure 116b may be configured such that a first mask layer 102, a second mask layer 104, a buffer layer 106, a first mandrel layer 108, and a first separation layer 110 are sequentially stacked.

The first mask layer 102, the second mask layer 104, and the buffer layer 106 may be the same as the first mask layer, the second mask layer, and the buffer layer as described with reference to FIG. 1, respectively.

According to an exemplary embodiment, the buffer layer 106 may include or may be formed of a material having lower electrical conductivity than the second mask layer (e.g., polysilicon) located under the buffer layer 106.

According to the exemplary embodiment, the buffer layer 106 may include or may be formed of the same material as a spacer formed on a side wall of a first mandrel pattern in a subsequent process. The spacer may be provided as an etching mask for patterning the second mask layer.

The first mandrel layer 108 may include or may be formed of a material having etching selectivity with respect to the spacer. In addition, since the first mandrel layer 108 is a sacrificial layer used to form the spacer, the first mandrel layer 108 may include or may be formed of a material that may be easily removed.

According to the exemplary embodiment, the first mandrel layer 108 may include or may be formed of amorphous carbon. The first separation layer 110 may include or may be formed of silicon oxynitride. The first separation layer 110 may have a thickness that is thinner than a thickness of the first mandrel layer 108.

In some exemplary embodiments, the first mandrel layer 108 may be formed of the same material as the second mask layer. For example, the first mandrel layer may be formed of polysilicon. In this case, the first separation layer may not be formed.

Referring to FIG. 30, first and second photoresist patterns 220a and 220b may be formed on the mask layer structure 116b in the first region and the second region, respectively. The first separation layer 110 and the first mandrel layer 108 may be sequentially etched by using the first and second photoresist patterns 220a and 220b as an etching mask. Therefore, a first mandrel pattern 208a and a first separation layer pattern 210a may be formed on the buffer layer 106 in the first region, and a second mandrel pattern 208b and a second separation layer pattern 210b may be formed on the buffer layer 106 in the second region.

The second photoresist pattern 220b may cover the mask layer structure 116b on the second region. Accordingly, a width of the second photoresist pattern 220b may be greater than a width of the first photoresist pattern 220a.

When the anisotropic etching process is performed, an upper portion of the first separation layer pattern 210a on the first region may be partially removed as the first photoresist pattern 220a is consumed. Meanwhile, the second separation layer pattern 210b on the second region, which has a width that is wider than a width of the first separation layer pattern 210a, may be rarely removed by etching loading. Therefore, the first separation layer pattern 210a may be thinner than the second separation layer pattern 210b.

Thereafter, the first and second photoresist patterns 220a and 220b may be removed.

When the above process is performed, a structure that is similar to the structure shown in FIG. 5 may be formed. In other words, the first separation layer and the first mandrel layer may be patterned through a photolithographic etching process to form the same structure as shown in FIG. 5.

Referring to FIG. 31, a spacer layer may be conformally formed on the first mandrel pattern 208a, the first separation layer pattern 210a, the second mandrel pattern 208b, the second separation layer pattern 210b, and the buffer layer 106, and the spacer layer may be anisotropically etched. Therefore, a spacer may be formed on side walls of the first mandrel pattern 208a and the first separation layer pattern 210a. Thereafter, the first mandrel pattern 208a and the first separation layer pattern 210a may be removed.

The processes described above may be substantially the same as the processes as described with reference to FIGS. 6 to 8.

Thereafter, the same processes as described with reference to FIGS. 9 to 18 may be performed. Therefore, as shown in FIG. 18, a first trench and a first active pattern may be formed in the substrate in the first region. A second trench and a second active pattern may be formed in the substrate in the second region.

While exemplary embodiments have been particularly shown and described, it will be understood by one of ordinary skill in the art that variations in form and detail may be made therein without departing from the spirit and scope of the claims.

What is claimed is:

1. A method for manufacturing a semiconductor device, the method comprising:
    sequentially stacking a mask layer, a buffer layer, a first mandrel layer, and a second mandrel layer on a first region and a second region of a substrate;
    forming first mandrel patterns having a line shape while being spaced apart from each other on the first region and forming a second mandrel pattern covering the first mandrel layer on the second region, by patterning the second mandrel layer, wherein the first mandrel patterns and the second mandrel pattern are disposed on the first mandrel layer;
    forming a first spacer contacting a side wall of each of the first mandrel patterns and a side wall of the second mandrel pattern on the first mandrel layer;
    removing the first mandrel patterns;
    forming third mandrel patterns having a line shape on the first region and forming a fourth mandrel pattern covering the buffer layer on the second region, by patterning the first mandrel layer by using the first spacer and the second mandrel pattern as an etching mask, wherein the third mandrel patterns and the fourth mandrel pattern are disposed on the buffer layer;
    forming a second spacer contacting side walls of the third mandrel pattern and the fourth mandrel pattern on a top surface of the buffer layer;
    removing the third mandrel patterns;
    forming a buffer layer pattern and a preliminary mask pattern on the first region and the second region of the substrate by etching the buffer layer and a portion of the mask layer by using the second spacer and the fourth mandrel pattern as an etching mask;
    removing the fourth mandrel pattern; and
    forming a mask pattern by etching the preliminary mask pattern by using the buffer layer pattern as an etching mask,
    wherein the buffer layer includes a material having an electrical conductivity lower than an electrical conductivity of the mask layer, and having etching selectivity with respect to the mask layer.

2. The method of claim 1,
wherein the buffer layer includes a same material as the second spacer or a material having a same electrical conductivity as the second spacer.

3. The method of claim 1,
wherein the second spacer includes silicon oxide, and
wherein the buffer layer includes an insulating material including a silicon-oxygen bond.

4. The method of claim 3,
wherein the buffer layer includes silicon oxide or silicon oxynitride.

5. The method of claim 1,
wherein each of the second spacer and the buffer layer are formed through an atomic layer deposition (ALD) process.

6. The method of claim 1,
wherein the mask layer includes polysilicon.

7. The method of claim 1,
wherein the mask layer and the first mandrel layer include a same material.

8. The method of claim 1,
wherein the mask layer and the first mandrel layer include mutually different materials, and
where the first mandrel layer includes amorphous carbon.

9. The method of claim 8, further comprising:
forming a separation layer on the first mandrel layer.

10. The method of claim 1,
wherein the forming of the buffer layer pattern and the preliminary mask pattern on the substrate, the removing of the fourth mandrel pattern, and the forming of the mask pattern by etching the preliminary mask pattern are performed in situ.

11. The method of claim 1,
wherein the forming of the buffer layer pattern and the preliminary mask pattern on the substrate, the removing of the fourth mandrel pattern, and the forming of the mask pattern by etching the preliminary mask pattern are performed in situ.

12. The method of claim 1,
wherein a width of the second mandrel pattern is greater than a width of each first mandrel pattern of the first mandrel patterns.

13. A method for manufacturing a semiconductor device, the method comprising:
sequentially stacking a mask layer, a buffer layer, a first mandrel layer, a separation layer, and a second mandrel layer on a first region and a second region of a substrate;
forming first mandrel patterns having a line shape while being spaced apart from each other on the first mandrel layer on the first region and forming a second mandrel pattern covering the first mandrel layer on the second region, by patterning the second mandrel layer, wherein the first mandrel patterns and the second mandrel pattern are disposed on the first mandrel layer;
forming a first spacer contacting a side wall of each of the first mandrel patterns and a side wall of the second mandrel pattern on the first mandrel layer;
removing the first mandrel patterns;
forming third mandrel patterns and first separation layer patterns having a line shape on the first region and forming a fourth mandrel pattern and a second separation layer pattern covering the buffer layer on the second region, by patterning the separation layer and the first mandrel layer by using the first spacer and the second mandrel pattern as an etching mask, wherein the third mandrel patterns, the first separation layer patterns, the fourth mandrel pattern, and the second separation layer pattern are disposed on the buffer layer;
forming a second spacer contacting side walls of the third mandrel pattern, the first separation layer patterns, the fourth mandrel pattern, and the second separation layer pattern on a top surface of the buffer layer;
removing the third mandrel patterns and the first separation layer patterns;
forming a buffer layer pattern and a preliminary mask pattern on the first region and the second region of the substrate by etching the buffer layer and a portion of the mask layer by using the second spacer and the fourth mandrel pattern as an etching mask and removing the second separation layer pattern;
removing the fourth mandrel pattern; and
forming a mask pattern by etching the preliminary mask pattern by using the buffer layer pattern as an etching mask,
wherein the buffer layer includes a material having an electrical conductivity lower than an electrical conductivity of the mask layer, and having etching selectivity with respect to the mask layer.

14. The method of claim 13,
wherein the buffer layer includes a same material as the second spacer or a material having a same electrical conductivity as the second spacer.

15. The method of claim 13,
wherein the second spacer includes silicon oxide, and
wherein the buffer layer includes an insulating material including a silicon-oxygen bond.

16. The method of claim 13,
wherein the buffer layer includes silicon oxide or silicon oxynitride.

17. The method of claim 13,
wherein the mask layer includes polysilicon.

18. The method of claim 13,
wherein the forming of the buffer layer pattern and the preliminary mask pattern on the first region and the second region of the substrate by removing the second separation layer pattern, the removing of the fourth mandrel pattern, and the forming of the mask pattern by etching the preliminary mask pattern are performed in situ.

19. A method for manufacturing a semiconductor device, the method comprising:
sequentially stacking a mask layer, a buffer layer, and a first mandrel layer on a first region and second a second region of a substrate;
forming first mandrel patterns having a line shape on the first region and forming a second mandrel pattern covering the buffer layer on the second region, by patterning the first mandrel layer, wherein the first mandrel patterns and the second mandrel pattern are disposed on the buffer layer;
forming a first spacer contacting walls of the first mandrel patterns and the second mandrel pattern on the buffer layer;
removing the first mandrel patterns;
forming a buffer layer pattern and a preliminary mask pattern on the first region and the second region of the substrate by etching the buffer layer and a portion of the mask layer by using the first spacer and the second mandrel pattern as an etching mask;
removing the second mandrel pattern; and
forming a mask pattern by etching the preliminary mask pattern by using the buffer layer pattern as an etching mask,
wherein the buffer layer includes a material having an electrical conductivity lower than an electrical conductivity of the mask layer, and having etching selectivity with respect to the mask layer.

20. The method of claim 19,
wherein the buffer layer includes a same material as the first spacer or a material having a same electrical conductivity as the first spacer.

* * * * *